(12) United States Patent
Wu et al.

(10) Patent No.: US 7,403,338 B2
(45) Date of Patent: Jul. 22, 2008

(54) MICROLENS FOR PROJECTION LITHOGRAPHY AND METHOD OF PREPARATION THEREOF

(75) Inventors: Ming-Hsien Wu, Kaohsiung (TW); George M. Whitesides, Newton, MA (US); Kateri E. Paul, Everett, MA (US)

(73) Assignee: President & Fellows of Harvard College, Cambridge, MA (US)

( * ) Notice: Subject to any disclaimer, the term of this patent is extended or adjusted under 35 U.S.C. 154(b) by 0 days.

(21) Appl. No.: 11/333,764

(22) Filed: Jan. 17, 2006

(65) Prior Publication Data

US 2007/0019306 A1    Jan. 25, 2007

Related U.S. Application Data

(63) Continuation of application No. 10/384,080, filed on Mar. 7, 2003, now Pat. No. 7,057,832, which is a continuation of application No. 10/120,847, filed on Apr. 10, 2002, now abandoned.

(60) Provisional application No. 60/283,102, filed on Apr. 10, 2001.

(51) Int. Cl.
*G02B 3/00* (2006.01)
*G03B 27/52* (2006.01)

(52) U.S. Cl. .......................... 359/651; 355/55
(58) Field of Classification Search ................ 359/650, 359/811, 651
See application file for complete search history.

(56) References Cited

U.S. PATENT DOCUMENTS 3,838,358 A    9/1974    Vanderleeden 4,689,291 A    8/1987    Popovic et al.
4,986,633 A    1/1991    Ohta (Continued)

FOREIGN PATENT DOCUMENTS

EP    1054270 A1    11/2000

(Continued)

OTHER PUBLICATIONS

Aizenberg, J. et al., "Imaging the irradiance distribution in the optical near field," *Appl. Phys. Lett.*, vol. 71, No. 26, 1997, pp. 3773-3775.

(Continued)

*Primary Examiner*—Jordan Schwartz
*Assistant Examiner*—James C Jones
(74) *Attorney, Agent, or Firm*—Wolf, Greenfield & P.C.

(57) ABSTRACT

Methods and systems for effecting responses on surfaces utilizing microlens arrays including microoptical components embedded or supported by a support element and positioned from the surface at a distance essentially equal to the image distance of the microoptical component with spacer elements are disclosed. Microlens arrays can be used to manipulate incident energy or radiation having a distribution in characteristic property(s) defining an object pattern to form a corresponding image pattern on a substrate surface. The energy can be light having a pattern or a specific wavelength, intensity or polarization or coherence alignment. The image pattern can have features of order 100 nm in size or less produced from corresponding object patterns having features in the order millimeters. The size of the object pattern can be reduced by the microlens arrays described by a factor of 100 or more using a single step process to form the image patterns.

27 Claims, 21 Drawing Sheets

U.S. PATENT DOCUMENTS

| | | | |
|---|---|---|---|
| 5,324,623 | A | 6/1994 | Tsumori |
| 5,373,335 | A * | 12/1994 | Street .......................... 396/155 |
| 5,450,157 | A | 9/1995 | Rees |
| 5,453,876 | A | 9/1995 | Hamada |
| 5,512,131 | A | 4/1996 | Kumar et al. |
| 5,517,279 | A | 5/1996 | Hugle et al. |
| 5,627,923 | A | 5/1997 | Kakizaki |
| 5,723,264 | A | 3/1998 | Robello et al. |
| 5,774,240 | A | 6/1998 | Gotto et al. |
| 5,900,160 | A | 5/1999 | Whitesides et al. |
| 5,973,844 | A * | 10/1999 | Burger ........................ 359/622 |
| 6,016,185 | A | 1/2000 | Cullman et al. |
| 6,031,619 | A | 2/2000 | Wilkens et al. |
| 6,051,836 | A | 4/2000 | Kirihata et al. |
| 6,057,925 | A | 5/2000 | Anthon |
| 6,124,974 | A | 9/2000 | Burger |
| 6,133,986 | A | 10/2000 | Johnson |
| 6,172,814 | B1 | 1/2001 | Watanabe et al. |
| 6,180,239 | B1 | 1/2001 | Whitesides et al. |
| 6,195,201 | B1 | 2/2001 | Kock |
| 6,200,709 | B1 | 3/2001 | Nuytkens et al. |
| 6,545,739 | B1 | 4/2003 | Matsumoto et al. |
| 6,594,415 | B1 | 7/2003 | Cappiello et al. |
| 6,600,460 | B1 | 7/2003 | Mays |
| 6,766,094 | B2 | 7/2004 | Smith et al. |
| 6,800,860 | B2 | 10/2004 | Dietz et al. |
| 6,841,096 | B2 | 1/2005 | Quake et al. |
| 6,930,837 | B2 * | 8/2005 | Shafer et al. ................. 359/649 |
| 7,057,832 | B2 | 6/2006 | Wu et al. |
| 7,106,519 | B2 | 9/2006 | Aizenberg et al. |
| 7,115,853 | B2 | 10/2006 | Jiang et al. |
| 2003/0031438 | A1 | 2/2003 | Kambe et al. |

FOREIGN PATENT DOCUMENTS

| | | |
|---|---|---|
| JP | 06-075105 | 10/1994 |
| JP | 07-209506 | 8/1995 |
| WO | WO 94/11781 | 5/1994 |
| WO | WO 02/084340 A1 | 10/2002 |

OTHER PUBLICATIONS

Aizenberg, J. et al., "Imaging profiles of light intensity in the near field: applications to phase-shift photolithography," *Applied Optics*, vol. 37, No. 11, 1998, pp. 2145-2152.

Alkaisi, M. et al., "Nanlithography using wet etched silicon nitride phase masks," *J. Vac. Sci. Technol.* B, 16, 1998, pp. 3929-3933.

Berger, C. et al., "A microlens-array-based optical neural network application," *Pure Appl. Opt.*, vol. 6, 1997, pp. 683-689.

Bohren, C. "Scattering By Particles," *Physical Optics*, Chap. 6, Penn. State U., 6.1-6.21.

Brody, J. et al., "A self-assembled microlensing rotational probe," *Applied Physics Letters*, vol. 74, No. 1, 1999, pp. 144-146.

Byrne, D.M. et al., "Infrared mesh filters fabricated by electron-beam lithography," *J. Vac. Sci. Technol.*, B3(1), 1985, pp. 268-271.

Dändliker, R. et al., "Non-conventional techniques for optical lithography," *Microelectronic Engineering* 27 (1995), pp. 205-211.

Denkov, N. et al., "Mechanism of Formation of Two-Dimensional Crystals from Latex Particles on Substrates," *Langmuir* 1992, 8, pp. 3183-3190.

Djomehri, I. et al., "Zone-plate-array lithography in the deep ultraviolet," *J. Vac. Sci. Technol*, B 16(6), 1998, pp. 3426-3429.

Friese, M. et al,. "Three-dimensional imaging with optical tweezers," *Applied Optics*, 1999, vol. 38, No. 31, pp. 6597-6603.

Goodberlet, J. G., "Patterning 100 nm features using deep-ultraviolet contact lithography," *Appl. Phys. Lett.* 76, 667-669 (2000).

Gorman, C. et al., "Use of a Patterned Self-Assembled Monolayer To Control the Formation of a Liquid Resist Pattern on a Gold Surface," Reprinted from *Chemistry of Materials*, 1995, 7. vol. 7, No. 2, 1995, pp. 252-254.

Gupta, S. et al., "Infrared filters using metallic photonic band gap structures on flexible substrates," *App. Physics. Letter*, 71 (17), 1997, pp. 2412-2414.

Hayashi, S. et al., "Imaging by Polystyrene Latex Particles," *Journal of Collond and Interface Science*, vol. 144, No. 2, 1991, pp. 538-547.

Ida, M. et al., "LETI's FED Patterning technique," *European Semiconductor*, 1997.

Ida, M. et al., " New Microlithography Technique for Large Size Field Emission Displays," *Euro Display 1996*, p. 177-180.

Jacoby, M., "Photonic Crystals: Whole Lotta Holes," C&EN Chicago, *Science Technology*, 1998 C&EN, pp. 38-43.

Joannopoulos, J. et al., "Photonic crystals: putting a new twist on light," *Nature*, vol. 386, 1997, pp. 143-149.

Kim, E. et al., "Solvent-Assisted Microcontact Molding: A Convenient Method for Fabricating Three-Dimensional Structures on Surfaces of Polymers," *Advanced Materials*, 1997, v. 9, No. 8, pp. 651-654.

Kim, E. et al., "Fabrication of Arrays of Channel Waveguides by Self-Assembly Using Patterned Organic Monolayers as Templates," *Advanced Materials*, 1996, 8, No. 2, pp. 139-142.

Kogler, K. et al., "Infrared filters fabricated from submicron loop antenna arrays," *Applied Optics*, vol. 27, No. 1, 1998, pp. 18-19.

Kumar, A. et al., "Patterned Condensation Figures as Optical Diffraction Gratings," *Science*, vol. 263, Jan. 7, 1994, pp. 60-62.

Levi, Goss B., "Visible Progress Made in Three-Dimensional Photonic Cystals," by:, *Physics Today*, 1999, pp. 17-19.

Milster, T. "Miniature and Micro-Optics," by:, *Optical Sciences Center University of Arizona*, Chap. 7, pp. 7.1-7.33.

Nussbaum, P. et al., "Design, fabrication and testing of microlens arrays for sensors and microsystems," *Pure Appl.*, Opt 6, 1997, pp. 617-636.

Qin et al., "Photolithography with Transparent Reflective Photomasks," *J. Va. Sci. Technol.*, B16(1), pp. 98-103 (Jan./Feb. 1998).

Richel, A. et al., "Observation of Bragg reflection in photonic crystals synthesized from air spheres in a titania matrix," *Applied Physics Letters*, vol. 76, No. 14, 2000, pp. 1816-1818.

Rigby, P., "A photonic crystal fibre," *Nature*, vol. 396, 1998, pp. 415-416.

Rogers, J. et al., "Generating ~90 nanometer features using near-field contact-mode photolithography with an elastomeric phase mask," *J. Vac. Sci. Technol.* B 16(1), 1998, pp. 59-68.

Rogers, J. et al., "Quantifying distortions in soft lithography," *J. Vac. Sci. Technol.* B 16(1), 1998, pp. 88-97.

Rogers, J. et al., "Wave-front engineering by use of transparent elastomeric optical elements," *Applied Optics*, vol. 36, No. 23, 1997, pp. 5792-5795.

Roulet, J. et al., "Microlens systems for fluorescence detection in chemical microsystems," *Opt. Eng.*, 40(5), 2001, pp. 814-821.

Roulet, J. et al., "Fabrication of Multilayer Systems Combining Microfluidic and Microoptical Elements for Fluorescence Detection," *Journal of Microelectromechanical Systems*, vol. 10, No. 4, 2001.

Sasaki, M. et al., "Micro-objective manipulated with optical tweezers," *Applied Physics Letters*, 70 (6), 1997, pp. 785-786.

Schwider, J. et al. "Possibilities and limitations of space-variant holographic optical elements for switching networks and general interconnects," *Applied Optics*, vol. 31, No. 35, 1992, pp. 7403-7410.

Smith, H. , "A proposal for maskless, zone-plate-array nanolithography," *J. Vac. Sci. Technol.*, B 14(6), 1996, pp. 4318-4322.

Völkel, R. et al., "Microlens Lithography and Smart Masks," *MicroElectronics Engineering*, 35 1997, pp. 513-516.

Völkel, R. et al., "Microlens Lithography: A new approach for large display fabrication," *MicroElectronic Engineering*, 30, 1996, pp. 107-110.

Völkel, R. et al., "Microlens array imaging system for photolithography," *Optical Engineering*, 35(11), 1996, pp. 3323-3330.

Wendt, J. et al., "Fabrication of high performance microlenses for an integrated capillary channel electrochromatograph with fluorescence detection," *J. Vac. Sci. Technol.*, B 17(6), 1999, pp. 3252-3255.

Wilbur, J. et al., "Elastomeric Optics," *Chemical Materials.*, 8, 1996, pp. 1380-1385.

Wilbur, J. et al., "Lithographic Molding: A Convenient Route to Structures with Sub-Micrometer Dimensions," *Advanced Materials*, 7, No. 7, 1995, pp. 649-652.

Wu, M.H. et al., "Fabrication of arrays of two-dimensional micropatterns using microspheres as microlenses for projection photolithography," *Appl. Phys. Lett.*, v. 78, pp. 2273-2275 (2001).

Wu, H. et al., "Reduction Photolithography Using Microlens Arrays: Applications in Gray Scale Photolithography," *Analytical Chemistry*, vol. 74, No. 14, 2002, pp. 3267-3273.

Xia, Y. et al., "Complex Optical Surfaces Formed by Replica Molding Against Elastomeric Masters," *Science*, vol. 273, Reprint Series, 1996, pp. 347-349.

Xia, Y. et al., "Monodispersed Colloidal Spheres: Old Materials with New Applications," *Advanced Materials*, 2000.

Zhao, X. et al., "Demonstration of waveguide couplers fabricated using microtransfer molding," *Applied Physics Letters*, vol. 71, No. 8, 1997, pp. 1017-1019.

Zoorob, M. et al., "Complete photonic bandgaps in 12-fold symmetric quasicrystals," *Nature*, vol. 404, pp. 740-743, 2002.

"Photonic band gap materials," http://www.icmm.csic.es/cefe/pbgs.htm, 2001, pp. 1-4.

Rudge (IBM Journal) Apr. 1963, pp. 146-150.

International Search Report in PCT/US02/11623.

Traut, S., et al., "Holographically recorded gratings on microlenses for a miniaturized spectrometer array," 2000Society of Photo-Optical Instrumentation Engineers, Opt. Eng., vol. 39, No. (1), pp. 290-298 (2000).

Verpoorte, E., "Chip vision -optics for microchips," The Royal Society of Chemistry, 2003, Lap Chip, 2003, 2, 42N-52N.

Wolffeenbuttel, R., "State-of-the-Art in Integrated Optical Microspectrometers," IEEE Transactions on Instrumentation and Measurement, vol. 53, No. 1, Feb. 2004.

"Photonic Crystals," *Basic Energy Science*, Center for Data Intensive Computing (CDIC), 2001 pp. 1-3.

"Photonic Crystals," wysiwyg://9/http://www.tf.uni-kiel.de/matwis/amat/photonics/photoncrys.html, 2001, pp. 1-3.

"Photonic Crystals," http://www.physics.utoronto.ca/~norman/group/research_pbg.html, 2001, pp. 1-3.

Hutley, M., et al., "Microlens Arrays," *Physics World*, Jul. 1991, p. 27-32.

* cited by examiner

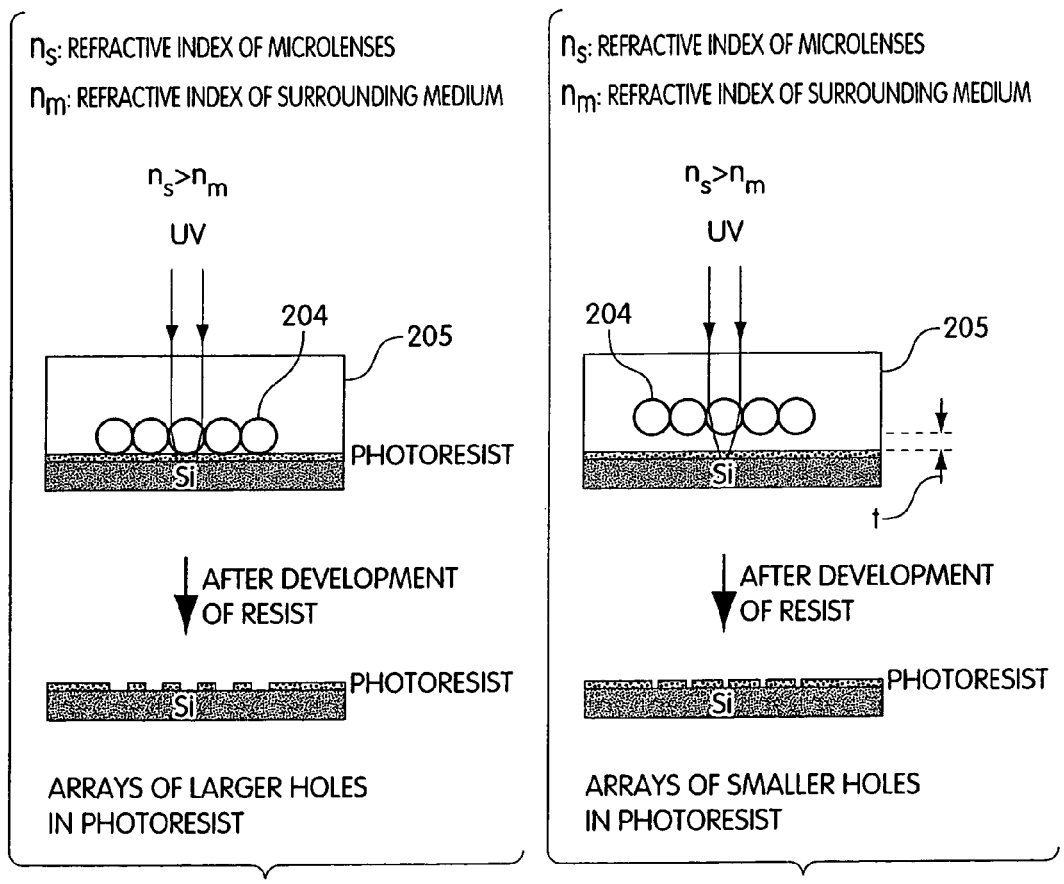

MICROLENS FOR PROJECTION LITHOGRAPHY AND METHOD OF PREPARATION THEREOF

RELATED APPLICATIONS

This application is a continuation of and claims the benefit of priority under 35 U.S.C. § 120 of U.S. Ser. No. 10/384,080, filed Mar. 7, 2003, now U.S. Pat. No. 7,057,832 which is a continuation of Ser. No. 10/120,847, filed Apr. 10, 2002 now abandoned which claims the benefit of priority under 35 U.S.C. § 119(e) to U.S. Ser. No. 60/283,102, filed Apr. 10, 2001, the contents of which are incorporated herein by reference.

GOVERNMENT RIGHTS

This invention was sponsored by AFOSR/SPAWAR Grant No. N66001-98-1-8915. The government has certain rights in this invention.

BACKGROUND OF THE INVENTION

1. Field of the Invention

The present invention relates to patterning electromagnetic radiation and, more particularly, to microlens lithography and methods thereof.

2. Description of the Related Art

Lithography may be used to generate a pattern on a surface, such as a semiconductor wafer. A repeating pattern-may be generated by projecting an image through an array of microlenses. For example, ultraviolet photolithography can include any of the following: contact photolithography, proximity photolithography and projection lithography; each typically uses chromium masks. Other techniques that can be used in microlithography include, for example, electron-beam writing, ion-beam lithography and laser pattern writing.

Microlens arrays, photolithography and methods of fabrication and uses have been described by, for example, Popovic et al., in U.S. Pat. No. 4,689,291, Tsumori in U.S. Pat. No. 5,324,623, Hamada in U.S. Pat. No. 5,453,876, Robello et al. in U.S. Pat. No. 5,723,264, Goto et al. in U.S. Pat. No. 5,774,240, Burger in U.S. Pat. Nos. 5,973,844 and 6,124,974, Cullman et al. in U.S. Pat. No. 6,016,185, Johnson in U.S. Pat. No. 6,133,986, Kock et al. in U.S. Pat. No. 6,195,201 B1, and Nuytkens et al. in U.S. Pat. No. 6,200,709 B1.

Microlens lithography has been described by Völkel et al. in "Microlens Lithography: A new approach for large display fabrication," *Microelectronic Engineering*, v. 30, pp. 107-110 (1996), in "Microlens array imaging systems for photolithography," *Opt. Eng.*, v. 35(11), pp. 3323-3330 (November 1996), and in "Microlens Lithography and Smart Masks," v. 30, pp. 513-516 (1997). They have also been described by Nussbaum et al. in "Design, fabrication and testing of microlens arrays for sensors and Microsystems," *Pure Appl. Opt.*, v. 6, pp. 617-636 (1997) and by Dändliker et al. in "Non-conventional techniques for optical lithography," *Microelectronic Eng.*, v. 27, pp. 205-211(1995).

Microlens lithography-related techniques have been described by Ida et al. in "LETI's FED patterning technique," *European Semiconductor*, pp. 97-99 (April 1997) and in "12.3: New Microlithography Technique for Large Size Field Emission Displays," *Euro Display*, pp. 177-180 (1996), by H. Smith in "A proposal for maskless, zone-plate-array lithography," *J. Vac. Sci. Technol.* B14(6), pp. 4318-4322 (November/December 1996), and by Djomehri et al. in "Zone-plate-array lithography in the deep ultraviolet," *J. Vac. Sci. Technol.*, B 16(6), pp. 3426-3429 (November/December 1998).

SUMMARY OF THE INVENTION

In one embodiment, the present invention is directed to a device comprising an optical component associated with a support element. The system also comprises a spacing element in contact with a surface of the support element. The spacing element is sized to displace the optical component from an image surface by a distance essentially equal to the image distance of the optical component.

In another embodiment, the present invention is directed to a device comprising an optical component embedded within a flexible support element and positioned from a surface of the flexible support element at a distance essentially equal to the image distance of the optical component.

In another embodiment, the present invention is directed to a method comprising embedding an optical component within an transparent support element. The method also comprises providing a spacing element associated with the support element. The spacing element is sized to displace the optical component from an image surface by a distance essentially equal to the image distance of the optical component.

In another embodiment, the present invention is directed to a method comprising supporting an optical component with a flexible support element. The method also comprises providing a spacing element associated with the flexible support element. The spacing element is sized to displace the optical component from an image surface by a distance essentially equal to the image distance of the optical component.

In another embodiment, the present invention is directed to a device comprising an optical component supported by a flexible support element and positioned at a distance from a surface of the flexible support element that is essentially equal to the image distance of the optical component.

In another embodiment, the present invention is directed to a method comprising embedding an optical component within a flexible support element such that a distance between the optical component and a surface of the flexible support element is essentially equal to the image distance of the optical component.

In another embodiment, the present invention is directed to a method for inducing a response on a substrate. The method comprises projecting a pattern of electromagnetic radiation through a device positioned adjacent a surface of the substrate. The device comprises an optical component embedded within a support element and is positioned from the surface of the substrate at a distance essentially equal to the image distance of the optical component.

In another embodiment, the present invention is directed to a method for inducing a response on a substrate. The method comprises projecting electromagnetic radiation through a device positioned on a surface of the substrate. The device comprises an optical component supported by a flexible support element and positioned from the substrate by a distance essentially equal to the image distance of the optical component.

In another embodiment, the present invention is directed to a method for creating an image of a pattern on a surface of a substrate. The method comprises projecting a pattern of electromagnetic radiation through a device comprising an optical component associated with a support element to create an image of the pattern on the surface of the substrate, wherein a feature of the image is at least 100 times smaller than a corresponding feature of the pattern.

In another embodiment, the present invention is directed to a method for producing an image pattern. The method comprises projecting a pattern through a device comprising at least one optical component, thereby generating an image pattern on an image surface that corresponds to the pattern. The method also comprises changing a position or a dimension of a feature of the pattern to effect a change in a corresponding feature of the image pattern that is at least about 100 times smaller than the change in position or dimension of the feature of the pattern.

In another embodiment, the present invention is directed to a method for producing a feature on a substrate. The method comprises projecting an energy beam onto the substrate through a device comprising an optical component, supported by a flexible support element, positioned from the substrate by a distance essentially equal the image distance of the optical component while moving the energy beam according to a predetermined pattern.

In another embodiment, the present invention is directed to a method comprising disposing at least one optical component to a transparent layer having a maximum thickness. The layer forming a spacer between the optical component and a substrate is in contact with the transparent layer. The maximum thickness is essentially equal to an image distance of the optical component.

In another embodiment, the present invention is directed to a method comprising positioning, in contact with a substrate, at least one transparent microlens affixed to a transparent layer having a maximum thickness, forming a spacer between the microlens and the substrate in contact with the transparent layer, essentially equal to a focal length of the microlens. The method also comprises projecting an image through a mask having a pattern thereon and onto the microlens to create a structure on the substrate.

In another embodiment, the present invention is directed to a system. The system comprises a microlens that comprises at least one light-focusing component associated with a transparent layer such that the component is spaced apart from a plane defined by a surface of the layer by a distance essentially equal to an image distance of the light-focusing component. The system also comprises an electromagnetic radiation projector positioned at a predetermined distance from a mask having a pattern thereon. The mask is positioned at a predetermined distance from the microlens as well as a substrate positioned against the surface of the layer.

In another embodiment, the present invention is directed to a method comprising the steps of providing a microlens that comprises at least one optical component associated with a transparent membrane and positioning a surface of a substrate to be imaged in contact with a surface of the membrane so that the smallest distance separating the optical component from the surface of the substrate is essentially equal to the image distance of the optical component. The method also comprises projecting an image of a pattern through the optical component and onto the surface of the substrate.

In another embodiment, the present invention is directed to a method comprising projecting a pattern of an energy beam through a device positioned adjacent a surface of a substrate. The device comprises at least one optical component supported by a support element. The electromagnetic radiation has a specific wavelength.

In another embodiment, the present invention is directed to a method comprising projecting a pattern of an energy beam through a device positioned on a surface of a substrate. The device comprises at least one optical component supported by a support element. The pattern has a specific intensity distribution.

In another embodiment, the present invention is directed to a method comprising projecting a pattern of an energy beam through a device on a surface of a substrate. The device comprises at least one optical component that has a largest dimension that is less than about 1 mm.

In another embodiment, the present invention is directed to a method comprising projecting a pattern of an energy beam through a device on a surface of a substrate. The device comprises at least one graded-index fiber.

In another embodiment, the present invention is directed to a method for fabricating structures on an optically reactive substrate. The method comprises projecting electromagnetic radiation through a microlens array comprising an optical component associated with a flexible support element. The optical component is disposed at a distance from the substrate at an image distance of the optical component.

Other advantages, novel features, and objects of the invention should become apparent from the following detailed description of the invention when considered in conjunction with the accompanying drawings, which are schematic and are not intended to be drawn to scale. In the figures, each identical, or substantially similar component that is illustrated, is represented by a single numeral or notation. For clarity, not every component is labeled in every figure, nor is every component shown where illustration is not necessary to allow those of ordinary skill in the art to understand the invention.

BRIEF DESCRIPTION OF THE DRAWINGS

Non-limiting embodiments of the present invention will be described by way of example with reference to the accompanying drawings in which:

FIG. 6 is a schematic diagram of a method for fabricating structures on a substrate according to another embodiments of the present invention;

FIG. 7 is a schematic diagram of a method for fabricating structures on a substrate according to another embodiments of the present invention;

FIG. 16A shows a PDMS substrate having features fabricated thereon using the mask as shown in the upper left insert and FIG. 16B shows a developed photoresist material using the PDMS substrate shown in FIG. 16A as a conformal photomask.

DETAILED DESCRIPTION

Figure 1A:
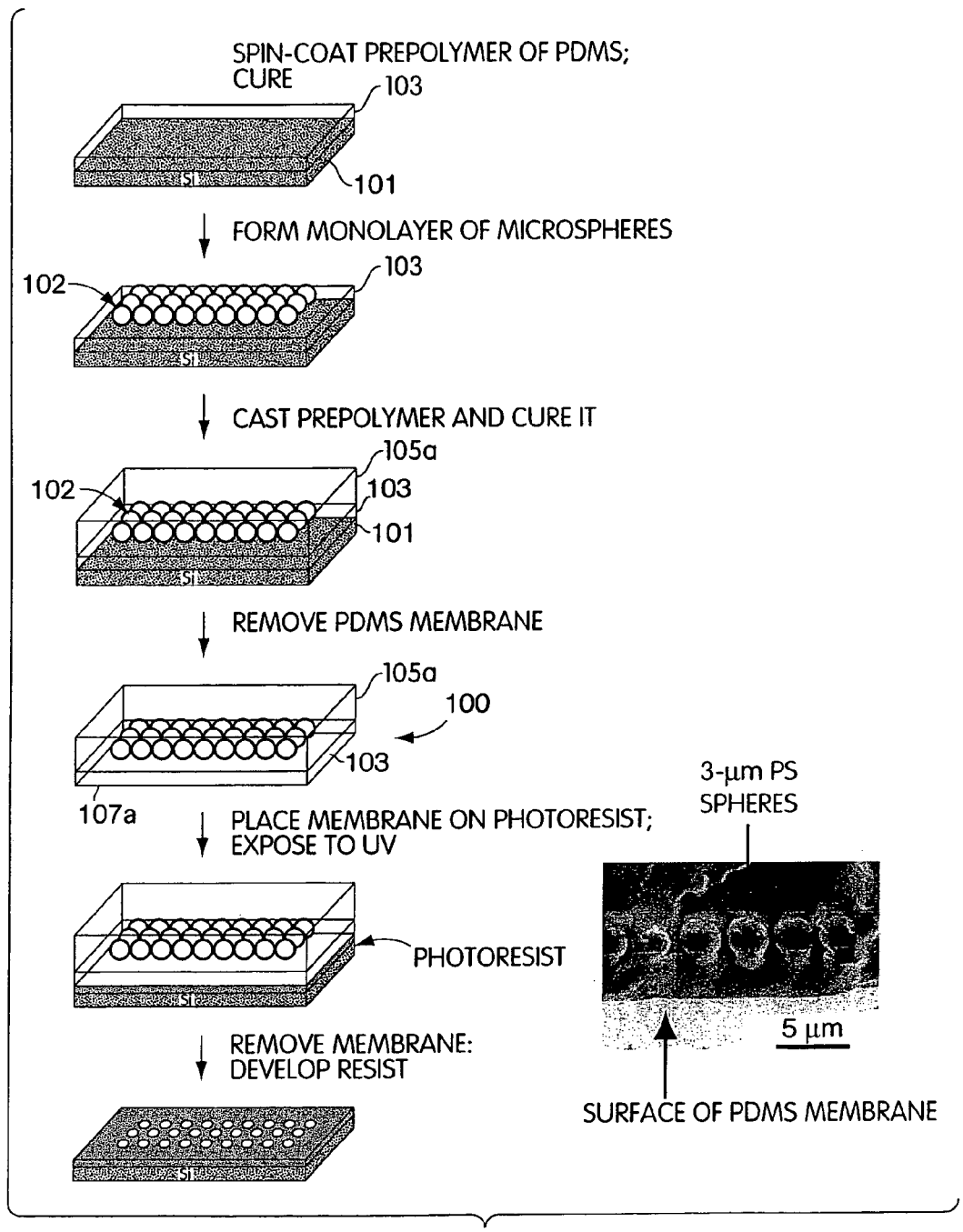
FIGS. 1A-1D are schematic diagrams depicting various embodiments for fabrication microlens array.

The present invention is directed, in some embodiments, to the manipulation of a transmitted energy, such as electromagnetic radiation or energy, such as light, to transform, effect, create, or inhibit a response on a substrate. In some embodiments, the present invention is directed to methods, and/or apparatus for performing the methods, for exposing (which can include control of the exposure) electromagnetic energy, which may have a preselected or predetermined characteristic or feature. In certain such embodiments, a target or image substrate or surface is affected to, for example, create a pattern (or create a reduced-size image of a predetermined pattern) on the target or image substrate. In some cases, a structure can be created that can, in certain embodiments, have features corresponding to a predetermined or specific pattern. In some aspects, the present invention can provide an optical system, and/or techniques, that can produce high-definition micrometer-scale patterns from a centimeter-scale pattern. Accordingly, in some embodiments, the present invention is directed to an optical component, and methods for fabricating and/or using such component. The optical components according to the invention include, but are not limited to, a lens or a mirror that can translate an object pattern to an image pattern having corresponding features to the object pattern.

In some cases, the present invention can provide an optical system comprising, for example, micro-scale optical components (and methods involving such components) configured to transform a patterned radiation to create corresponding patterns or structures on a substrate. In other cases, the present invention can provide an optical system comprising, for example, micro-scale optical components having specific or predetermined patterns that are configured to manipulate or transform unpatterned radiation to create a corresponding pattern or structure on a substrate.

In another aspect, the present invention is directed to methods of fabricating apparatus suitable for or capable of manipulating a feature, characteristic or property of electromagnetic radiation, such as the wavelength, intensity, polarization or coherence, so as to change, transform, effect, create or inhibit a response on a substrate. Thus, in some cases, the response effected is associated with a chemical reaction or dissociation such that the substrate can be topographically modified. In yet another aspect, the present invention is directed to methods of using an apparatus suitable for or capable of manipulating a feature, characteristic or property of electromagnetic radiation so as to change, transform, effect, create or inhibit a response on a substrate. In some embodiments, the invention is directed to an optical apparatus, such as a lens or a microlens array. The invention is directed to a microlens array that is capable of using, manipulating or modifying a feature, characteristic or property of electromagnetic energy. The invention can also be directed to methods for using a microlens array for utilizing, manipulating or modifying a feature, characteristic or property of electromagnetic energy on radiation.

The present invention may be further understood in light of the following definitions. As used herein, the term "electromagnetic radiation" is meant to include both visible and non-visible electromagnetic radiation or light that is capable of being manipulated by an optical component such as a lens.

The term "optical component" can include passive elements or devices that do not produce electromagnetic radiation but rather diffract or refract or otherwise change a property of electromagnetic radiation or light. Thus, the optical component can, for example, be a prism, a mirror, a diffractive lens, a refractive lens, reflective lens, a spherically-shaped lens, an aspherically-shaped lens, a non-spherically-shaped lens, a plano-convex-shaped lens, a polygonal convex-shaped lens or a graded-index optical fiber or fiber optical component. An "optical component" also includes active elements or devices that produce electromagnetic radiation including, for example, lasers or light-emitting diodes.

A "lens array" is a device having at least one optical component and a "microlens array" is a lens array having at least one microoptical component. The term "microoptical component" refers to an optical component comprising a micrometer scale optical component or element and includes, for example, microlenses, micromirrors and microprisms. The term "micro" in the above context is meant to denote a relative scale and, in some embodiments, is meant to indicate a device, apparatus, element, component, feature or pattern having a smallest dimension of less than about 1 millimeter. In some embodiments, micrometer scale components are preferred.

Optic or even microoptical components comprising refractive lenses can be characterized by an index of refraction or distribution of refractive indices. An optical component may be a "light-focusing element" that is capable of refracting, bending or changing the direction of the propagating of waves of electromagnetic radiation so that the waves can converge, or diverge, on or near a preferred plane, location or region. The distance between the optical component and the preferred plane is referred to as the "image distance." Accordingly, the image distance corresponds to the distance on an axis of the optical component upon which incident parallel light waves converge to form an image, preferably corresponding to the best image or an image having a high resolution. The image distance depends on, inter alia, the index of refraction of the optical components, the medium through which the electromagnetic radiation travels around the optical component, the size of the optical component and the wavelength of the radiation. The "image plane" is the plane generated by the locus of image distances of each optical component of a system. In one embodiment, the image distance can be the focal length of the optical component. In other embodiments, the image distance may be a distance less than or greater than the focal length of the optical component. Thus, in some cases where the distance between a mask having an object pattern thereon and the optical component is much greater than the size (e.g., the diameter) of the optical component, the image distance is almost the same as the focal length of the optical component. In some cases, such as when the optical components are of substantially the same size and lie on one plane, then the optical components have a focal plane consisting of the locus of focal lengths of the optical components. Image distortion, in general, can be reduced by using optical components having low numerical apertures (NA), such as, for example, those with NA less than about 0.25, or in some cases, less than about 0.125. The present invention, however, is not limited to embodiments requiring the generation of patterns or structures on a substrate that is spaced from an optic component by its image distance. Certain embodiments of the invention can produce patterns or structures fabricated on a substrate that result from interference associated with a plurality of optical components manipulating electromagnetic radiation.

In general, scattering and interference between spherically-shaped optical components can depend on the distance between the optical components and the size and composition thereof as well as the material properties of the surrounding medium. Typically, scattering and/or interference increases with decreasing optical component dimensions or decreasing separation distances therebetween. For example, if the distance between two adjacent spherically-shaped optical components is greater than three times their diameter, the effect of scattering can typically be neglected. Further, where radiation traverses through optical components having lower index of refraction than the surrounding medium, then there will typically result incident illumination divergence which can, in turn, traverse through neighboring optical component and effect scattering. For example, patterns can be generated using collimated light and interference effects can be produced and controlled by varying the distance between microoptical components and the imaging surface. In some cases, the patterns thus produced depend, at least to some extent, on the interference of light waves from neighboring microoptical components.

In another embodiment, control of the path of the electromagnetic radiation can be effected by altering the shape of the medium through which it passes. An asymmetrically-shaped lens array comprising an irregularly or asymmetrically-shaped support element comprising microoptical components can alter a pathway of electromagnetic radiation. In other embodiments, the lens array comprises a support element having a predetermined geometrical shape that can deflect incident illumination in a predetermined manner. For example, a lens array comprising a wedge-shaped support element including spherically-shaped optical components can obliquely alter the direction of incident illumination, originally directed normal to an imaging surface, traversing therethrough resulting in illumination striking the imaging on a surface at angle that is not normal to the surface. In such instances, the resultant pattern or structures fabricated on the substrate can be obliquely oriented In another embodiment, a pattern can be generated on an imaging surface, using graded-index optical components. For example, in one embodiment, a pattern can be generated by controlling or varying the intensity, wavelength or both, of radiation emitted by or transmitted through each graded-index optical component, and/or by controlling or displacing the graded-index optical component, or any combination thereof. Such techniques can be used with or without a mask as explained in more detail below.

In another embodiment, lithography techniques can be used in connection with the inventive lens/microlens arrays, with or without utilization of an object mask, in order to generate a pattern on a substrate with organized illumination of, for example, collimated light. In one example, collimated light may be aimed at a microlens array including, for example, microoptic components comprising graded-index optical components and moved along a desired pathway. As the collimated light passes through the microoptical components of the microlens array, the imaging substrate (e.g., a photoresist material) can react or respond to the transmitted light energy. In this way, a pattern corresponding to the pathway traversed by the collimated light source can be generated. Because of the size reduction effects of the inventive microlens arrays, for movements of the light source over distances on the order of millimeters, the generated image pattern would typically be a micrometer scale pattern and, depending, inter alia, on the properties of the light source, could include nanometer scale features. Such features can have shapes, sizes, and/or positional characteristics corresponding to, for example, the light source path, the exposure period or even the relative intensity of the light applied to different portions of the surface.

In one embodiment, an optical component is provided that is made of optically transparent material. Some examples of usable materials include, but are not limited to a polymer such as polystyrene, polydimethylsiloxane (PDMS) or a gas such as air. An "optically transparent material" is one being at least partially transparent to at least one wavelength of light. In some embodiments, the optical component can be formed of a fluid or other formable material. Preferably, the material is transparent, even more preferably, the material is hardenable by, for example, crosslinking.

In one embodiment, a microlens array is provided that comprises at least one microoptical component affixed on, supported by or embedded within a supporting substrate or support element. The microoptical component can, in some embodiments, be embedded near a surface of the support element. In other embodiments, the microoptical component can be attached or secured to a surface of the support element. In some embodiments, the microlens array has a plurality of microoptical components that are arranged on a common plane, which is then designated as the "optical component plane" forming a "microlens array." The microlens array can, in some embodiments, include a plurality of microoptical component planes each including at least one embedded microoptical component. Further, the microoptical component planes can be, but need not be, parallel to each other. In one preferred embodiment, the microlens array comprises at least one microoptical component that is at least one of a diffractive lens, a refractive lens or a graded-index fiber. The graded-index optical components preferably have an index of refraction that increases or decreases with increasing radius. Additionally, the microlens array may comprise a combination of types of optical components; each arranged or positioned on a common optical component plane or on several optical component planes. In some cases, the microlens array or optic system of the present invention comprises a plurality of optical components having a variety of shapes and/or a variety of spatial or optical arrangements. For example, the optic system can comprise at least one spherically-shaped optical component and at least one graded-index fiber optical component.

In some embodiments, the microlens array comprises at least one optical component supported by a membrane or other support element, which in some cases, can be flexible so as to allow conformal contact with an imaging surface. The support element can be made of essentially any material capable of maintaining, supporting or holding an optical component in a selected, desired position. Preferably, the support element is made of essentially a material that is optically transparent such that it permits or allows the transmission or propagation of at least some electromagnetic radiation therethrough. In certain embodiments, the support element can be made of essentially any material that has an index of refraction that is different from that of the supported optical component, for example, less than or greater than the index of refraction of the supported optical component. In one preferred embodiment, the microlens array can include an optical component that is supported by a flexible support element and is positioned at a distance from a surface of the flexible support element which distance is essentially equal to the image distance of the optical component.

Moreover, the support element can be, selectively, pre-shaped into a predetermined shape or can have a random, irregular, a non-predetermined or asymmetric form. For example, the support element can be shaped as a cylinder, such as a rectangular or circular cylinder, or can be characterized by a wedge shape. In another embodiment, the support element may be shaped as a rectangular block, which may have flat or curved surfaces or a combination thereof. Wedge-shaped systems can be prepared by covering an optical component with the support material, tilting the covered optical component, and then curing or allowing the support material to solidify, at least partially, in the tilted position. Generally, in preferred embodiments, the support element can serve to arrange or position the optical components in a medium that is at least partially transparent to at least one wavelength of electromagnetic radiation.

In some embodiments, the support element can be formed as a shell, for example a curved shell such as a spherically-shaped, conical-shaped or parabolic-shaped shell. In preferred embodiments, the microlens array can include one or more optical components supported by or embedded within a support element such as a transparent rigid or flexible support element. In some cases, lithography can be performed using the non-flat or curved microlens arrays provided by the invention. In one such embodiment, incident illumination is projected through microoptical components embedded in a support element having the shape of a hemispherical shell, and then onto a complementarily shaped curved surface. If the microlens array has a curvature that is matched relative to the curvature of imaging surface, an ordered, non-distorted pattern or structures with features can be fabricated on the curved surface. In some embodiments, the substrate whereon the pattern or structures is fabricated can be non-planar and/or have surface indentations or protrusions or have spherical, aspherical, conical or cylindrical features thereon. The substrate surface can in certain embodiments have multiple planar aspects.

The optic array can, in some embodiments, further include a spacer or spacing element. The spacing element can be made of essentially any material suitable for bearing the load of the support element. In one embodiment, the spacing element is sized and positioned to displace the optical component(s), supported by or embedded within a support element, from an imaging surface or substrate by a distance that is predetermined. In some preferred embodiments, this predetermined distance is essentially equal to the image distance of the optical component. In one embodiment, the spacing element contacts at least a portion of a surface of the support element. The spacing element can potentially be configured to have a wide variety of shapes and configurations. For example, it can be spherically-shaped, aspherically-shaped, conical-shaped, cylindrically-shaped, etc. In some embodiments, the spacing element can also serve as the support element or the support element can also serve as a spacing element by being configured and sized to displace an optical component a minimum distance from an image surface that is about equal to the image distance of the optical component. In certain of such embodiments, the spacing element can be integrally formed as part of the support element.

In certain embodiments of the invention involving lithography, a photoresist material can be deposited on a substrate/imaging surface. The photoresist can be essentially any known photoresist, and typically is a polymeric material, such as polyurethane. The photoresist can be deposited by a variety of known techniques including, for example, dipping of the substrate in a dilute solution of the photoresist material (e.g., a solution of MICROPOSIT® S1805, available from the Shipley Company, L.L.C., Marlborough, Mass., diluted with poly(glycolmethylether acetate)), followed by slowly withdrawing the substance from the solution, for example at about 0.5 mm/sec in one embodiment. The wet photoresist-coated substrate can then be dried under suitable conditions as is known in the art (e.g., in one embodiment, at about 60° C. for about 20 minutes).

Notably, the reduction in features and image sizes achievable with the present invention can be at least about 10 times, preferably, 100 times, and even more preferably 1000 times. The methods provided by the present invention can, for example, in one particular embodiment, generate patterns or structures on a substrate over an area of about 2 $cm^2$ with features that are characterized by line widths not greater than about 200 nm and with gaps between neighboring features of not greater than about 100 nm from a patterned mask that is about 25 cm×25 cm. The mask can include features or patterns of features thereon. The mask patterns can be essentially any of a variety of types of mask patterns, such as a binary pattern, a black and white pattern, a gray-scale pattern, a colored pattern, or combinations thereof. Such mask patterns can be used to generate binary, gray-scale, multi-colored and/or multi-layered patterns or structures on a substrate. The inventive techniques can be used to generate multi-layer patterns without the need for using an aligner and chrome masks. Also, the inventive techniques can be used to generate an array of essentially uniform multi-layer patterns over an area greater than about 2 $cm^2$. Such multi-layer patterns produced by these techniques can in certain applications be used for fabricating articles and/or structures including, for example, color filters, gratings, frequency selective surfaces, photonic crystals, memories, and displays.

A microlens array comprising planar arrangement of microoptical components provided by the invention can be used in some embodiments to project a pattern that is provided on an illuminated mask so as to form a corresponding image pattern on an image plane. For example, a mask having cm-scale object pattern features and having (n)-colors can be used to generate an array of image patterns having μm-scale features with (n) colors (i.e., the composite optical patterns projected thus consisted of (n)-chromatic features). In certain such embodiments, the image substrate would typically be coated with a layer of photosensitive material so that multi-color patterns can be produced after exposure and development. After development, the photosensitive substrate would include thereon an array of (n)-color patterns. Each (n)-color pattern will be a corresponding size-reduced copy of the color pattern/object on the mask.

In some embodiments, a plurality of photosensitive materials can be deposited on the substrate, each deposit occurring after succeeding lithographic exposures. Further, each layer of photosensitive material can be selected to be sensitive to a specific wavelength or range of wavelengths of the incident light. In some embodiments, (n)-layers of photosensitive materials can be coated on the substrate, each layer being sensitive to a specific wavelength or range of wavelengths. After exposure and development, the (n)-layer photosensitive materials would produce an array of overlayed (n)-layer patterns. The techniques of such embodiments of the invention can be used to produce an array of single-layer, multi-color patterns or an array of multi-layer patterns in a single exposure without the need for use of multiple-chrome masks and an aligner typically required by conventional techniques. Typically, in such embodiments, the transparency mask can be placed adjacent a broadband illumination source at a distance, for example, about 15-25 cm from the microlens array and the substrate. The substrate can be coated with one or more photosensitive layers and can preferably be separated from the microlens array by a distance essentially equal to the image distance. After exposure of the photosensitive layer(s), each photosensitive layer can be developed using appropriate developer-chemicals and techniques as known in the art. The patterns produced using these techniques can, if desired, be transferred to an elastomeric membrane using, for example, the molding technique described below to fabricate or modify alternative structures.

Referring now to the figures, in preferred embodiments, an optical component can be prepared according to the invention by self-assembly, by dewetting of selectively prepared surfaces, or by reflow melting techniques. FIGS. 1A-1D are schematic diagrams showing, according to various embodiments, techniques for preparing an exemplary microlens array comprising 3 μm diameter polystyrene spherically-shaped optical components embedded within a PDMS support element. The insert in FIG. 1A is a photocopy of a micrograph showing the 3 μm diameter spherically-shaped polystyrene microoptical components in the PDMS substrate.

The microlens array 100 typically has at least one optical component 102, and preferably includes an arrangement of optical components, such as microspheres or spherically-shaped optical components, having diameters typically between about 1.5 to about 1000 μm. The microlens array can be used in lithography to optically reduce relatively large images to relatively smaller images on an image plane (e.g., millimeter (mm) scale images, micrometer (μm) scale images). In one particular embodiment, the image distance is about the same as the diameter as the optical components. The array of microlenses is preferably arranged on a plane so that an image can be projected on a common image plane. In some typical embodiments, the microoptical component of the microlens arrays will have a diameter within the range of about 1.5 to about 1000 μm. Some of such arrays can be used, for example, to reduce centimeter (cm) scale images into μm scale images.

Referring again to FIG. 1A, a repetitive pattern having features characterized by line widths of about 200 nm and gaps between neighboring features of less than about 100 nm can be generated on a substrate using the array of microlenses 100 as part of an optical system further including a light source, such as an optical projector, and a pattern on a mask (e.g., in the form of a printed transparency) from which the pattern on the substrate is generated. To perform lithography with such an optical system, the membrane 100 would typically be placed in conformal contact with a photoresist-coated substrate.

Figure 2:
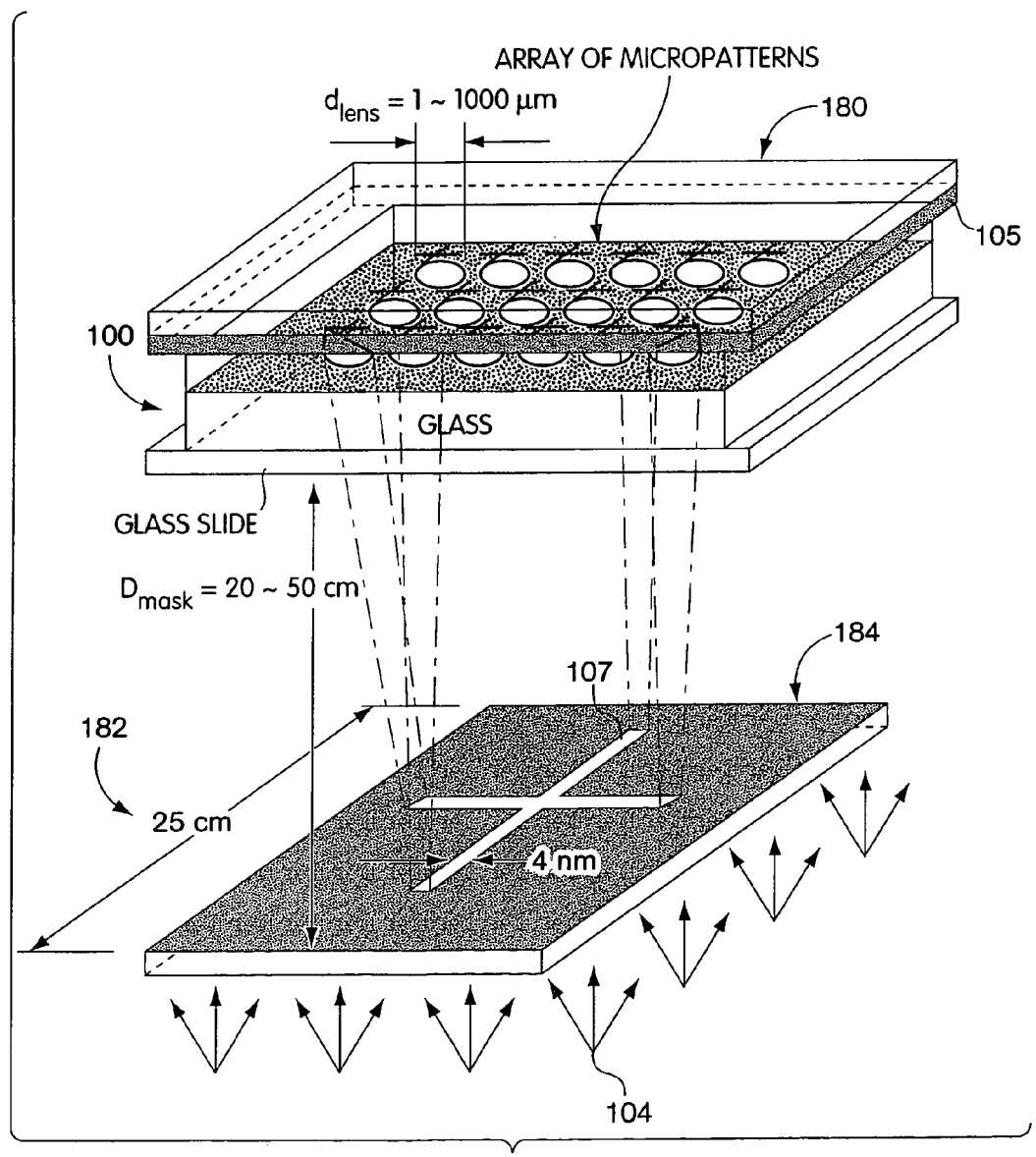
FIG. 2 is a schematic diagram of another embodiment of the invention showing a pattern generation system.

FIG. 2 shows a typical optical system using a microlens array 100 fabricated according to the techniques described below or any other appropriate technique known in the art. See, for example, "Lithographic Molding: A Convenient Route to Structures with Sub-Micrometer Dimensions" by Wilbar et al., *Adv. Mater.*, v. 7 n. 7, pp. 649-652 (1995). A light source 104 typically provides illumination through a mask 182. In some embodiments, a mask need not be used, rather, for example, an ordered or patterned light source, such as collimated, polarized or wavelength-specific light source, can alternatively be used to produce an image pattern. The microlens array is typically positioned on a positioning stage (not shown) so that the distance between the mask and the microlens array can be adjusted. In the embodiment shown in FIG. 2, a layer photoresist material 105, as the substrate receiving the changed, manipulated, directed or controlled electromagnetic energy, is placed in conformal contact with the microlens array 100. In one embodiment, the photoresist material is positioned at a distance from the optical components in the microlens array at a distance this is essentially equal to the image distance of the optical components. Upon illumination, or transmission of energy such electromagnetic radiation or light, energy is manipulated or otherwise controlled as it passes through the microlens array so as to effect a change on the photoresist material. In typical embodiments as illustrated, the image of the pattern 107 of the mask 182 is size-reduced and projected on the photoresist material 105. The electromagnetic energy producing the sized-reduced image, can, in some cases, cause a reaction or other effect on the photoresist material corresponding to a feature or characteristic of the pattern 107 on the mask 182. In some embodiments, the image reduction procedure can be repeated using an identical or different patterned mask so as to create overlaying or superimposed patterns on the photoresist material.

In some embodiments, a commercially available overhead transparency projector can be used as a light source. Optionally, an optical diffuser, typically positioned in front of the projector lamp, can be used to homogenize the illumination. In such embodiments, the mask would typically be placed on the projector Fresnel lens. Subsequent to lithography according to the invention, the surface topology of the photoresist material can, if desired, be examined with a scanning electron microscope, such as a LEO 982 FE-SEM microscope (not shown), available from LEO Electron Microscopy, Inc., Thornwood, N.Y., at, for example, 1 keV, or other known imaging equipment.

In some embodiments, contact-mode photolithography can be performed according to the invention to create a pattern of images or structures on a surface. Flexible lens array devices provided by the invention suitable for contact mode photolithography can be fabricated from elastomeric material as described below. Such devices can, for example, include optical components including, but not limited to, shaped light refractive structure as well as shaped cavity structures (e.g., cavities/microcavities or wells/microwells). Such optical components can, in certain embodiments, manipulate the intensity and/or the direction of incident illumination. Depending on the characteristics of the optical components of the devices, recessed or protrusive microstructures can be created on a surface by performing lithography utilizing the devices.

The present invention in some aspects can provide a pattern of images or structures produced on a substrate by projecting energy, such as electromagnetic radiation, onto the substrate through a microlens array comprising an optical component. In some embodiments, the pattern or structure can be fabricated by, for example, translating at least one, or both, of the microlens array and the source of energy with respect to the substrate.

In one exemplary embodiment of contact-mode photolithography, a PDMS membrane comprising embedded microoptical components is placed on a substrate that has been spin-coated with positive-tone photoresist material, such as MICROPOSIT® S1800 photoresist material, ($n_{PR}$=1.7) available from Shipley Company, L.L.C., Marlborough, Mass. The membrane is placed in conformal contact with the photoresist material. The photoresist material can typically have a thickness ranging from 0.4 µm to 1.5 µm. An ultraviolet radiation source, such as a Karl Suss Model MJB3 UV400 mask aligner, available from Suss MicroTec, Waterbury Center, Vt., can be used to expose the photoresist material to electromagnetic radiation. In some particular examples, the mask aligner can be used with a mercury lamp that has emission peaks at 365, 405, and 436 nm. UV wavelengths can be advantageously utilized in the current example, because PDMS absorbs little of the incident UV intensity and can be considered essentially transparent to 350-450 nm UV. As the incident UV light passes through the microlens array, it can be concentrated/focused by each optical component onto the photoresist material substrate. After exposure, the photoresist material can be developed in a developer solution, such as MICROPOSIT® 351 developer available from Shipley Company, L.L.C., Marlborough, Mass. In some cases, the developer can be diluted with purified water (18 MΩ-cm) if needed, as apparent to those skilled in the art.

In some embodiments, a characteristic or property of the electromagnetic radiation can be selectively controlled before effecting a response on the substrate. For example, electromagnetic radiation may be filtered to create or alter, selectively, a shape or pattern or intensity distribution or a wavelength or polarization orientation so as to effect specific responses on the substrate. In some embodiments, the electromagnetic radiation can be manipulated so as to create different incident patterns in order to effect overlaying patterns on the substrate. Because of the flexibility of the microlens array provided according to some embodiments, lithography can be performed on non-planar surfaces or curved surfaces such as, for example, aspherical, spherical or cylindrical shaped surfaces.

In some embodiments, the microlens array comprises a plurality of optical components and can be used, as described above, to effect repeated or uniform patterned responses on the substrate. That is, the microlens array can be used to create a pattern, on an imaging substrate, comprising multiple repeating subimages which have substantially identical features. For example, a plurality of substantially identical repeating subimages can be projected on the imaging substrate using a microlens array having a plurality of microoptic components. Each subimage is created by patterned electromagnetic radiation projected from a microoptic component. The projected electromagnetic radiation can then effect a response on the imaging substrate and the aggregate of subimages thus forming the repeated patterned responses. In some embodiments, electromagnetic radiation can be manipulated or controlled by using a plurality of masks simultaneously, or sequentially, thus providing a combination of images so as to form or fabricate two-dimensional (2D) and three-dimensional (3D) patterns or features on the substrate as explained in more detail below.

The microlens arrays can also be fabricated using a number of techniques including, for example, a "reflow method", a "self assembly method" and a "molding method" described in more detail below in Example 1. Typically, in the reflow method, a layer of optically transparent material is uniformly deposited on a surface. A mask, having a predetermined pattern (e.g., in the form of an object) can be used to create a predetermined image pattern (i.e., corresponding to the object pattern of the mask) of optical components on the material. This can be performed, for example, by depositing a light- or electromagnetic radiation-reactive material on the surface and then selectively exposing desired regions of the light-reactive material to electromagnetic radiation through the mask. These light-exposed regions can undergo a reaction or transformation, for example a cross-linking reaction. Subsequently, the unexposed regions may be washed away or otherwise removed (e.g., by an appropriately selected solvent) leaving behind the hardened/semi-hardened regions, which comprise the optical components. These array can, if desired, be heated under controlled conditions so to effect a shape change of the array and/or optical components. For example, semi-hardened light-exposed regions can be heated to soften or even melt such regions thus forming (it is believed via surface tension effects) plano-convex regions. In one particular embodiment of the above-described method, a layer of light-sensitive material, such as a photoresist material, is spin-coated on a substrate surface to coat, preferably uniformly, the surface. The substrate can be made of essentially any material capable of supporting the photoresist material such as, but not limited to, a glass plate or a silicon wafer. Conventional lithography can then be used to form a predetermined array or pattern of circular or disk-shaped photoresist structures on the surface. The photoresist material once exposed to the appropriate energy or light can crosslink and become semi-rigid or semi-hardened. Non-crosslinked regions can be etched/dissolved away to form patterned structures on the substrate. The substrate supporting the shaped photoresist structures can then be placed on a hot plate or other heating apparatus to melt the initially circular or disk-shaped structures so as to form smooth, curved and, preferably, plano-convex-shaped structures. These structures can then comprise the optical components or can be used as a mold or template for fabricating other structures, for example other optical components.

In the above-mentioned "self-assembly" method, patterned regions, of hydrophilic, or hydrophobic, self-assembled monolayers (SAM) are deposited, either randomly or in a predetermined pattern, on a substrate surface. A hydrophobic, or hydrophilic material is then deposited on the patterned SAM regions, for example, by dipping the substrate in a solution of the hydrophobic or hydrophilic material. If the pre-deposited SAM regions are hydrophilic, then a hydrophobic depositing material would typically be used; if the SAM region are hydrophobic, then, correspondingly, a hydrophilic depositing material would typically be used, depending, of course, on where such depositing material is desired to be positioned on the substrate surface. Because the depositing material can have the ability to selectively attach to the patterned SAM regions, a pattern of deposited material can thereby be created. The deposited material can then be chemically or physically altered so as to form a hardened or solidified element(s) (e.g., by controlled heating) comprising an optical component(s). For instance the deposited material can be formed into plano-convex-shaped components. In some embodiments, the deposited material is selected to be optically transparent and/or selective and/or reactive to specific wavelengths of electromagnetic radiation. In some embodiments, the depositing material can have a selected or predetermined index of refraction and, accordingly, can refract incident light to a focal point at an image distance from the material. This "self-assembly" technique may be further understood with reference to, for example, "Photolithography with Transparent Reflective Photomasks" by Qin et al., *J. Va. Sci. Technol.*, B16(1), pp. 98-103 (January/February 1998) and "Patterned Condensation Figures as Optical Diffraction Gratings" by Kumar et al., *Science*, v. 263, pp. 60-62, (Jan. 7, 1994), both of which are incorporated herein by reference in their entirety.

In some embodiments of the "self-assembly" technique, a transparent metallic thin film, for example Au/Ti, can be used to coat a glass substrate surface. A stamp or imprinting element, preferably a conformal imprinting element such as a flexible stamp made of PDMS with a predetermined patterned surface, is inked or otherwise coated with a compound that can readily form self-assembled monolayers, for example, hexadecanethiolates such as HDT or $HS(CH_2)_{15}CH_3$. This first SAM compound may be hydrophilic or hydrophobic. The stamp is then placed in conformal contact with the gold-coated glass substrate to form a first patterned SAM region. If HDT is used, this first SAM region would be hydrophobic. The gold-coated glass substrate having a pattern of first SAM regions corresponding to the stamp is then coated with a second SAM by, for example, dipping the substrate in a solution comprising the second SAM species. Preferably, the second SAM coats only the regions surrounding the first SAM regions. If the first SAM is hydrophobic then second SAM is preferably hydrophilic or at least, less hydrophobic. Similarly, if the first SAM is hydrophilic, the second SAM is preferably hydrophobic. Thus, the gold-coated substrate, after imprinting and coating, will typically have hydrophobic SAM regions and hydrophilic SAM regions. The resulting SAM-covered substrate can then be coated with a photoresist material, for example, MICROPOSIT® S1800® Series photoresist, available from Shipley Company, L.L.C., Marlborough, Mass. Preferably, the photoresist material is selected so that it adheres preferentially to the hydrophobic SAM sites or, in some cases, to the hydrophilic regions. In this way, an array of deposited photoresist material may be created in a pattern corresponding to the inking or stamping pattern. In a preferred embodiment, the photoresist material is selected so that when it is applied on hydrophobic sites, it displays a smooth, curved profile. The photoresist material can then be hardened by, for example, baking on a hot plate or a heating element to produce an array of hardened plano-convex structures comprising optical components. A support element can then be used to embed or otherwise support the formed optical components to form a microlens array.

In the above-mentioned "molding technique", a microlens array can be fabricated by first forming a mold having indentations therein for forming optical components and then fabricating the microlens array using the mold to form shaped structures corresponding to the indentations. In particular embodiments, a pre-existing microlens array of shaped optical components can be used as a die or mold, which can then subsequently be used to cast or fabricate other microlens arrays. The original microlens, utilized as the mold, can be produced as in any of the methods described herein or by any other appropriate method known in the art.

The surface of optical components used to cast the mold can be rendered less adhesive to the mold-forming material by, for example, silanizing the surface. In one embodiment, a molding material, such as PDMS, is cast and cured on such treated optical components to form a casting mold. This PDMS casting mold, having the corresponding imprint of the optical components can then be wetted with a solvent and placed on a coated substrate. Preferably, the solvent is selected to dissolve or at least partially dissolve the substrate coating material so that the dissolved material flows into and fills the indentations or recesses of the PDMS mold. After allowing the dissolved coating material to harden within the PDMS mold, the mold can then be removed, thus leaving behind a patterned array of optical components, corresponding in shape to the shape of the original optical component array from which the mold was fabricated. A support element can then be fabricated, if desired, for example by casting PDMS onto the hardened optical components to at least partially embed them. This technique can be further understood with reference to "Solvent-Assisted Microcontact Molding: A Method for Fabricating Three-Dimensional Structures on Surfaces of Polymers" by Kim et al., *Adv. Mater.*, v. 9, n. 8, pp. 651-654 (1997) incorporated herein by reference in its entirety.

In an alternative technique, a microlens array can be formed by depositing a solution or suspension of pre-formed light-refractive components (e.g., spherically shaped components) onto a substrate surface. The solvent component of the solution can then be evaporated away leaving behind an ordered crystal array of spherically-shaped optical components. A transparent material, for example PDMS, can then be cast around the ordered crystal array of spherically-shaped optical components thus fixing them in place to form a microlens array. Alternatively, other techniques for depositing the components on the surface (e.g., micromanipulation, etc.) could be employed.

Figure 3A:
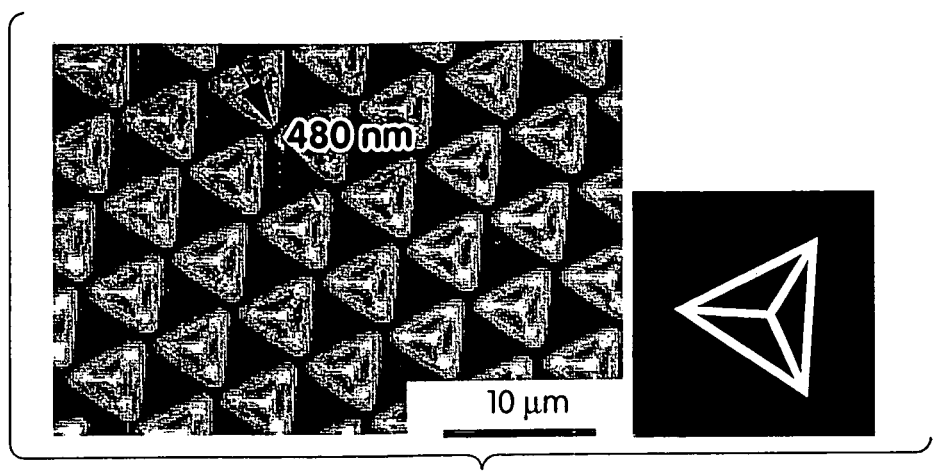
FIGS. 3A-3C are photocopies of micrographs showing an image pattern fabricated on a photoresist material substrate generated using spherically-shaped microoptical components, along with the corresponding object pattern masks utilized to fabricate the patterns (positioned below each SEM micrograph copy)
Figure 3B:
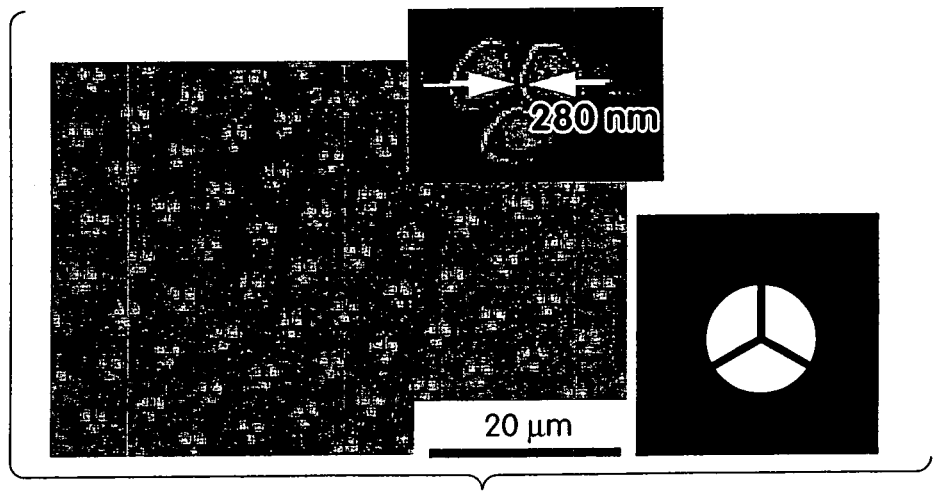
Figure 3C:
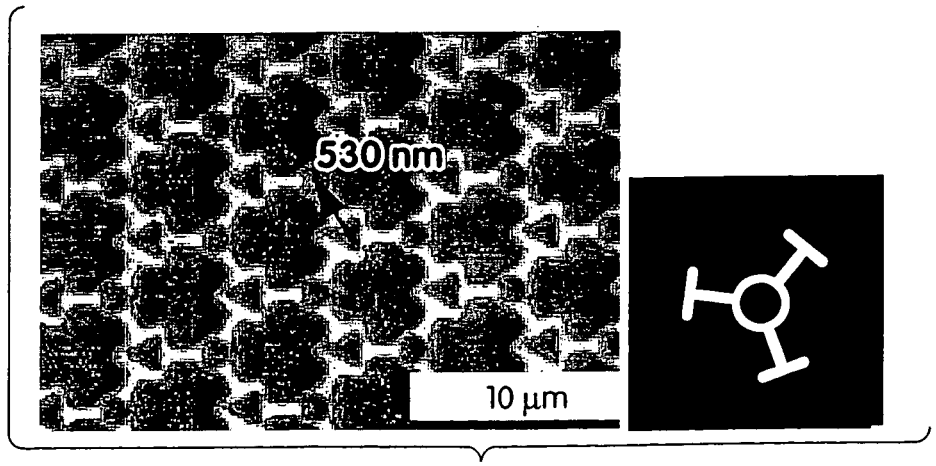

FIGS. 3A-3C are photocopies of SEM micrographs of some representative patterns formed on photoresist material that were generated by inventive microlens arrays comprising spherically-shaped optical components and the lithography techniques previously described. The periodicity of the patterns are essentially equal to the size of the spherically-shaped optical components. If the distance between the mask and the spherically-shaped optical components is fixed, the images formed on the image plane are typically proportional to the size of the features of image-forming pattern of the mask. For example, in preferred embodiments, images formed on the focal plane are no greater than about $\frac{1}{10}$ the size of the mask pattern fixture, in other cases no greater than about $\frac{1}{100}$ and in yet other cases no greater than about $\frac{1}{1000}$ the size of the mask pattern/feature. Notably, with careful control of exposure and/or intensity patterns with features having dimensions less than 200 nm between exposed regions can be created on a substrate.

Figure 4A:
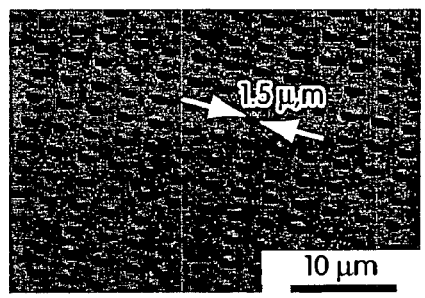
FIGS. 4A-4D are photocopies of micrographs of microlens arrays comprising various microoptical components according to various embodiments of the present invention.
Figure 4B:
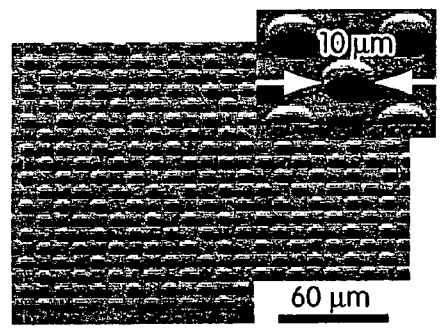
Figure 4C:
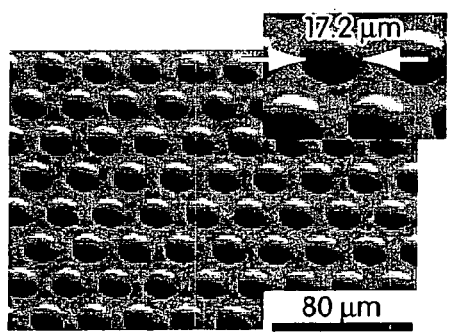
Figure 4D:
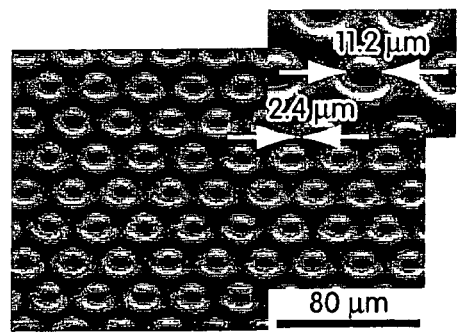

In another aspect of the invention, patterns or structures with interconnecting features can be created by proper orientation of the microlens array and, in some cases, the mask. For example, FIGS. 4A-4D show photocopies of SEM micrographs of microlens arrays comprising micpooptical components produced according to certain embodiments of the invention using the techniques described in Example 1, wherein, in some cases, interconnected patterns are fabricated thereon. A microlens array, comprising spherically-shaped optical components with a smallest cross-sectional dimension that is less than about 3 μm, as indicated in FIG. 4A, can be used to project simple patterns onto a photoresist material as exemplarily shown in FIGS. 5A-5D. Such patterns can be repetitive or singular, depending on, among other factors, the number of microoptical components involved. The pattern in the micrograph copies shown I FIGS. 5A-5D were fabricated using projection lithographic techniques described herein and with specific reference to Example 2

In another aspect of the invention, systems and methods for producing single-layer, patterns or multi-layer patterns without the need for use of multiple chrome masks or an aligner are provided. In such systems and methods, an array of microlenses can be placed or deposited on a transparent substrate, for example, a glass substrate, and coated with a transparent thin film. The thickness of the thin film is preferably equal to the image distance of the optical components. A photoresist layer can then be applied on the transparent thin film layer. Using projection lithography, for example, a repeating pattern can be generated on the photoresist layer utilizing the microlens array. After exposure and development of the photoresist layer, an array of patterns would be formed on the photoresist-containing substrate. To produce the first pattern layer, the pattern on the photoresist material can be transferred to a metallic thin film by lifting off the photoresist material with, for example, metals or metal films. To fabricate a second pattern layer, a second layer of photoresist material can be coated on the first pattern layer and projection lithography can be used to generate a pattern on the second photoresist layer. This second pattern can then be transferred by lift-off of the pattern on the photoresist material using a thin film of, for example, oxides. The second layer of patterns of oxides on the first layer patterns of metallic thin film may thus be generated.

The lift-off technique typically comprises depositing a thin film of metals onto a substrate by electroplating or evaporating metals, preferably by evaporating because, it is believed, the grain sizes of evaporated metals are smaller and the thickness of the metallic thin film is more uniform as described by, for example, Moreau, W., *Semiconductor Lithography*, Chapter 12, Plenum Press, New York 1988. For example, a photoresist material on a substrate is exposed to patterned electromagnetic radiation. Upon exposure, the photoresist material will react to the radiation and have patterns corresponding to the pattern of the radiation. Upon development using conventional techniques, exposed regions of the photoresist material typically harden and unexposed region can be removed exposing bare substrate. Electroplating or metal evaporation techniques can then be used to deposit a thin metal film on the substrate. Sonication, vibration or shocking with sonic waves, can be used, typically in acetone, to remove regions having developed photoresist material while leaving the deposited metal regions.

In another aspect of the invention, a microlens array comprising at least one optical component can be used to converge, diverge or direct, incident illumination, depending on the ratio of refractive indices between the optical components, ($n_s$), and the refractive index of the medium ($n_m$) surrounding the microoptical components. Notably, the response of the microoptical components with this technique can be characterized utilizing Mie analysis (as explained in detail by Born et al. in *Principles of Optics*, 6th ed., Pergammon Press, New York, N.Y., 1980, which is incorporated herein by reference in its entirety) or via known alternative analysis utilizing known principles of geometric optics. A low-index spherically-shaped optical component, $n_s < n_m$, typically causes collimated radiation to diverge whereas those with high-index, $n_s > n_m$, typically cause the radiation to converge and, if projected onto the focal plane, to form a bright spot. Further, collimated radiation projected through planar closed-packed (e.g., hexagonally close-packed) spherically-shaped optical components typically produces hexagonal optical patterns with six sides due to, it is believed, light-scattering effects from neighboring optical components.

In some embodiments, electromagnetic radiation(e.g., UV radiation, collimated visible light, or radiation with specific spatial intensity, wavelength, polarization or coherence) can be used, with or without an object mask and with or without a microlens array comprising optical components, to effect a response on a substrate surface, such effect including, for example, generating image patterns or structures on a substrate. In one embodiment, a switching of the spatial distribution of electromagnetic radiation may be used to effect a response on a substrate. For example, a light source may be switched on and off, preferably over a short time period, such as within a nanosecond to effect a response. A pattern may be generated using previously described lithographic methods with a microlens array by switching or changing the intensity and/or distribution of electromagnetic radiation and/or by using different masks with or without changing a property of the electromagnetic radiation within a short time, for example, within a nanosecond. Such techniques can be used to selectively fabricate structures on substrates which may or may not be repeating or uniform patterns.

In some embodiments of the invention, a microlens array comprising, for example, a plurality of spherically-shaped microoptical components in hexagonal close-packed configuration can be used with a source of collimated illumination to create an effect or response on an image surface. Each microoptical component, when illuminated, can receive light scattered from neighboring microoptical components and, because of optical phenomena related to interference, can produce features, which, depending on (at least partly) the distance $d_p$ between the optical component and the imaging surface, are characterized by a series of different patterns or structures. Such patterns or structures can be generated, for example, by adjusting $d_p$ such that interference phenomena may be advantageously exploited to generate a desired pattern or modify a projected image pattern. Such systems and techniques may be used, in some cases, in conjunction with determining an appropriate image distance using routine experimentation.

Some embodiments of the invention involve the use of multiple exposures in the context of the inventive microlens projection lithography techniques to generate superimposed patterns. Such multiple exposure techniques, described below, can be used to superimpose two or more identical or different aligned or misaligned patterns. In some such embodiments, the multiple exposure techniques can be utilized to generate superimposed patterns displaced from each other at predetermined intervals and/or by predetermined degrees. In another embodiment, positionally shifted or offset multiple exposure may be used to generate patterns using collimated light so that point or line patterns may be generated without the need for masks. Some advantages of the multiple exposure techniques provided according to the present invention include, for example, the capability to fabricate nanoscale features and/or, complicated patterns using relatively simple object masks and the ability to produce, multi-layered 2D patterns and multi-layered 3D patterns with minimal distortion of the image pattern.

The patterned surfaces and image patterns produced by multi-exposure techniques can be useful in applications involving the fabrication of a wide variety of useful structures and devices including, for example, arrays of circular, non-circular, spherical, aspherical, conical, parabolic and hyperbolic optical components such as lenses, mirrors and prisms, photomasks for use with other photolithographic techniques, master molds, master stamps (as used in, for example, soft lithography, near-field optics, chromium mask techniques and even conventional lithography), color filters, gratings, optical beam splitters, polarizers, frequency selective surfaces (FSS), photonic crystals, memories, microcircuits, pixel arrays, optical displays, such as flat panel displays including cell circuit, emitters and pixel arrays, optical interconnects, optical neural networks, digital optical processors, sensor arrays, transistor arrays and array-based biosystems such as, for example, micro-total analytical systems and biochips. Other application include systems and techniques for fabricating antireflection coatings, superhydrophobic surfaces, field emission arrays, information storage devices, microfluidic systems and microelectronic devices.

Microlens projection lithography may also be used to fabricate arrays of micropatterns on substrates of appropriate materials that can act as photonic crystals. Photonic crystals are typically optical articles that comprise arrays of dielectric microstructures and can filter light by suppressing, i.e., "rejecting," the transmission of incident illumination in specific ranges of wavelengths. Microlens arrays with optical components of sufficiently small sizes and with appropriate arrangements can, in some embodiments, be used for microlens projection lithography, without the need for the use of masks, to fabricate arrays of micropatterns in photoresist material. The arrays of micropatterns can be transferred to substrates by etching techniques to generate arrays of microstructures on the substrates. Such arrays of microstructures can be configured to act as photonic crystals.

Microlens projection lithography, according to the invention, utilizing certain predetermined arrangements of microoptical components can be used to fabricate arrays of microstructures in photoresist and with a spatial arrangement corresponding to that of the microlenses. These arrays of "photoresist microstructures" can, in some embodiments, be melted to form arrays of microlenses. These arrays of microlenses can then be used in various applications of microlens projection lithography. In one relevant example, they can be used in a microlens projection lithography technique performed with flood illumination and without the use of masks so as to produce arrays of micropatterns. After transferring the photoresist micropatterns to the substrates by etching techniques, for example, arrays of microstructures can be formed on the substrates. In one such example, photonic crystals may be fabricated by use of microlens projection lithography with gray-level masks. As discussed in the example below, microlens projection lithography with gray-level masks can be used to produce arrays of circular or noncircular microlenses.

Parameters important for the fabrication of FSS structures such as photonic crystals can be further understood with reference to Byrne et al. in "Infrared mesh filters fabricated by electron-beam lithography." *J. Va. Sci. Technol.*, B3(1), pp. 268-271 (January/February 1985); Gupta et al. in "Infrared filters using metallic photonic band gap structures on flexible substrates," *Appl. Phys. Lett.*, v. 71(17), pp. 2412-2414 (October 1997); and Kogler et al. in "Infrared filters fabricated from sub-micron loop antenna arrays," *Appl. Opt.*, v. 27, n. 1, pp. 18-19 (Jan. 1, 1988) each incorporated by reference in their entireties. Parameters important in the fabrication of photonic crystals may be further understood with reference to Richel et al. in "Observation of Bragg reflection in photonic crystals synthesized from air spheres in a titania matrix," *Appl. Phys. Lett.*, v. 76, n. 14, pp. 1816-1818 (Apr. 3, 2000) and Zoorob et al. in "Complete photonic bound gaps in 12-fold symmetric quasicrystals," *Nature*, v. 404, pp. 740-743 (Apr. 13, 2000), each incorporated herein by reference in their entireties. Parameters important in the fabrication of pixel arrays may be further understood with reference to Schwider et al. in "Possibilities and limitations of span-variant holographic optical elements for switching networks and general interconnects," *Appl. Opt.*, v. 31, n. 35, pp. 7403-7410 (Dec. 10, 1992); and Berger et al. in "A microlens-array-based optical neural network application," *Pure Appl. Opt.*, v. 6, pp. 683-689 (1997), each incorporated by reference in their entireties.

Arrays of optical microstructures, such as provided according to the invention, including, for example, gratings, beam splitters, lenses, mirrors, etc., can also be useful in many types of devices such as optical processing systems, and microelectromechanical systems as would be understood by those skilled in the art.

The inventive microlens projection lithography techniques using, for example, a microlens array with a 2D array of spherically-shaped microoptical components, can be used, in some embodiments, to generate a pattern on a photosensitive layer coated on a transparent substrate. The pattern on the transparent substrate can be subsequently transferred to metallic thin films by a lift-off transfer. Because the arrangement of the pattern on the transparent substrate would be substantially the same as the arrangement of the original microoptical components in the microlens array, there would typically be a one-to-one positional correspondence between the pattern on the substrate and the array of microoptical components. The patterned transparent substrate so produced by, for example, the lift-off technique, can, in some embodiments, be used as a photomask, for example, in one technique, such a photomask can be used in patterning the surface of microoptical components of a microlens array. In one such example, an array of microoptical components is first coated with a photosensitive layer, and the above-mentioned photomask is placed upon the microlens array, (i.e., between it and a source of illumination or radiation). The array of patterns on the photomask can be aligned so that the pattern features are incident onto the microoptical components. The photosensitive layer coated on the surface of the microlens array is exposed to electromagnetic radiation, for example, UV illumination, through the photomask. The exposed photosensitive layer can be developed with an appropriate developer. The developed photosensitive layer can be used to produce patterns on the surface of each microoptical component. These patterns can be transferred, if desired, directly to the surface of the microoptical components using a lift-off technique or by etching. In this way an array of surface-patterned microoptical components can be produced.

In some typical embodiments of the inventive lithographic techniques discussed previously the microlens array is typically positioned about 15 to about 25 cm above any photomask employed. The microlens array can, in some embodiments, be placed in conformal contact with the imaging substrate or layer. For an example involving a resist layer with a thickness of less than about 1 µm, the exposure time to radiation can be set for typically about 1 to 4 minutes, depending on the specific distance between the microlens array and the mask, the nature of the photoresist material/radiation, etc. After exposure to, for example, broadband illumination, the microlens array can be peeled from the photoresist layer, and the photoresist layer can be developed in an appropriate developing solution (e.g., sodium hydroxide for some photoresists), if desired. In one particular example, an array comprising a 2D arrangement of 6 µm diameter polystyrene spherically-shaped microoptical components, embedded in PDMS, can be used to generate pattern having linear 100 nm features line width between exposed regions. The pattern can be transformed into 3D structures, if desired, by, for example, etching through extended electromagnetic radiation or energy beam exposure periods followed by development or removal of the etched regions.

In some example embodiments, the formation of an image pattern on a substrate using, for example, a cross-shaped object pattern on a transparency mask having an about 4 mm mask pattern linewidth, can generate structures with corresponding sub-400 nm features. In some embodiments, the patterned image substrates can be fabricated utilizing photomasks with different gray-level distributions. The difference in gray-level distribution of different mask patterns typically results in a corresponding change in the three-dimensional profile of the patterns produced on the substrates, as exemplarily illustrated in FIGS. 12A-12C. These techniques can be used to create a range of 3D microstructure arrays or structures with specified profiles. Uniquely shaped and contoured features can be created by using gray-scale masks and controlling exposure/radiation distribution therethrough. The gray-scale masks can be used to produce a pattern of light incident on the microlens array and substrate with a spatial intensity distribution corresponding to the gray level distribution of the object pattern on the mask. Because a cm-size pattern on a mask can be projected to form a µm-size image on the substrate, a change in a feature or position of the mask pattern can produce a change in a feature of the image that is at least 100 times smaller. Thus, the profile of the microstructures created on a photoresist material at sub-100 nm scale can be adjusted or created by a 100 µm scale change in a gray scale density, position, or dimension of the mask pattern.

The above-described techniques can be used or extended to fabricate arrays of 3D microstructures with selected, predetermined profiles that can act as microoptical components that comprise microlenses or micromirrors. Further, by casting transparent materials, such as PDMS, onto the arrays of such 3D microstructures, the profiles of the microstructures can be transferred to the transparent materials. After the removal of the transparent materials from the arrays of 3D microstructures, arrays of microstructures with reverse or complementary profiles are thus formed on the surface of the transparent materials. The arrays of microstructures with appropriate corresponding profiles on the surface of the transparent materials can also be used as microoptical components.

Figure 8A:
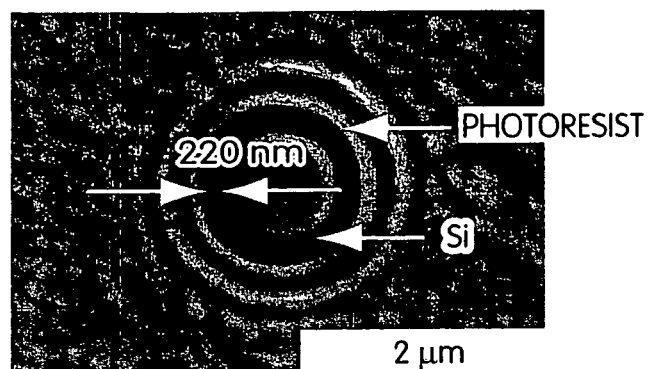
FIG. 8A-8C are photocopies of micrographs showing: typical patterns generated by a single, 1 μm air microoptical component; hexagonal-shaped structures generated by a hexagonal array of 1 μm air optical components; and a honeycomb pattern generated by an array of 1.4 μm diameter silica microoptical components, respectively.
Figure 8B:
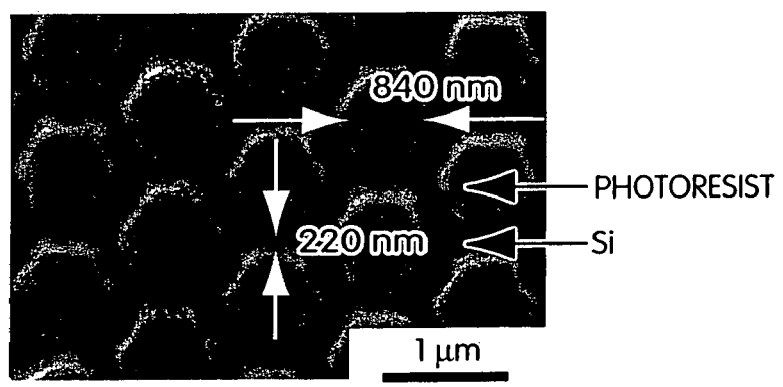
Figure 8C:
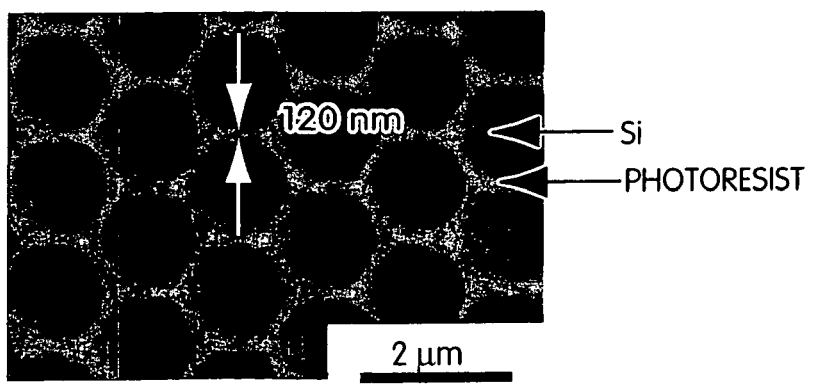

Microoptical components (e.g., spheres) with an index of refraction less than that of the surrounding medium tend to cause incident illumination to diverge. Such divergent light may enter neighboring components and contribute to multiple scattering effects: low-index components cause stronger multiple scattering than do high-index components. In one example, two types of low-index microoptical components were used to form microarrays in PDMS: (a) air and (b) silica based microoptical components. The contrast of refractive indices between air and PDMS ($n_{air}:n_{PDMS}$=1:1.4) is higher than that between silica and PDMS ($n_{SiO2}:n_{PDMS}$=1.37:1.4). Using the techniques as described below in Example 2, patterns or structures can be fabricated in photoresist, exemplary copies of which are shown in FIGS. 8A-8C. FIG. 8A shows a typical pattern generated by a single, 1 µm diameter spherical microoptical component formed of air. The width of the rings, in this case, 220 nm, can depend on the photoresist substrate thickness and on the exposure time. FIG. 8B shows hexagonal-shaped structures generated by a hexagonal array of spherical 1 µm air optical components. FIG. 8C shows exemplary honeycomb structures generated using an array of spherical 1.4 µm diameter silica microoptical components.

The inventive techniques can, in some embodiments, be used to produce cone-shaped 3D structures by using a microlens array having deep microwells. The microwells can be generated by using multiple (e.g., double) layers of microoptical components (e.g., spherically-shaped microoptical components) embedded or formed in a support element. The microwells used to generate the patterns can be produced, for example, by removing double layers of spherically-shaped microoptical components from a PDMS membrane surface by, for example, dissolution with an appropriate solvent. In some cases, the multi-layer microwell structures can be molded as cavities in the support element. For example, to form such a microwell structure, a mold comprising a single or multiple layers of polystyrene (or other appropriate material) structures (e.g., spherically-shaped structures) can be coated with a release agent (such as an aqueous solution of polyacrylic acid, available from, for example, Aldrich Chemical Company, Milwaukee, Wis., diluted to, for example, 1% in deionized water) and allowed to dry to form about a film (e.g., 0.5 mm thick) thereon. The dried film can act as a release layer between the polystyrene microspheres and the PDMS substrate. After casting and curing, the PDMS can be removed from the mold producing a microlens array comprising microwell components. In use, such microwells can perform as optical components having an index of refraction that depends on the surrounding atmosphere. For example, if used in air, the index of refraction (n) is about 1. In some embodiments, the optical components, during fabrication thereof, can be coated with a thin film by applying, and allowing to dry, an aqueous solution polyacrylic acid, as described above. The dried polyacrylic film can be oxidized and, in some cases, silanized with, for example, fluorosilane, to improve adhesion to a PDMS layer.

In some embodiments, the present invention can provide an optical system that can comprise spherically-shaped optical components that can exhibit optical phenomena including lensing or light scattering. Single optical component optical systems provided by the invention can be used as, for example, micro-objectives or even rotational probes for microscopy applications. Multi-optical component optical systems can be used to fabricate, for example, periodic dielectric microstructures. In other embodiments, a lens array comprising a mirror, or a plurality of differently shaped micromirrors, configured to reflect incident electromagnetic radiation on a surface to generate a pattern or structures thereon can be fabricated according to the techniques of the invention. In other embodiments, the optical components can comprise at least one reflective surface so that incident illumination can be reflected, for example onto a focal point at an image distance.

Microoptical components provided according to the invention can be embedded in a transparent support substrate and have at least one surface exposed to air or other gas such that incident illumination passing the optical component also traverses through the air. In some arrangements, there is no spacing element utilized. Such a microlens array, comprising the microoptical components, would typically be placed on a substrate including a layer of photosensitive materials, of predetermined thickness, having refractive indices lower than the refractive index of the microoptical components of the microlens array. Due to the ratio, greater than 1, of the refractive indices between the microlenses and the photosensitive layer, microimages can be formed on the substrate without the use of a spacing element on the surface of the microlenses. In this case, the photosensitive layer itself can act as a spacing element, with the microimages being formed on the bottom of the photosensitive layer for appropriately selected thicknesses of the layer. In some embodiments, structures can be fabricated by utilizing a reflective substrate coated with a structure-forming material, for example, photoresist material. Subsequently, microlens lithography, as described previously, can be performed to fabricate three-dimensional structures by, for example, controlled extended incident illumination so as to effect a change or chemical reaction on the exposed surface. Such techniques utilizing reflective substrates can be advantageous because, it is believed, the increased reflectivity of the substrate can enhance standing wave effects and create ring-type features that can have nm-scale definition.

These surface-patterned substrate, or microoptical components, can be useful for a wide range of application such as for use as novel microoptical components, such as beam splitters or filters, components in microelectromechanical systems, sensor arrays, arrays of light emitters, and for providing new types of colloidal particles or colloids, materials for nano- or micro-technology, materials for biotechnology, and advanced materials for other fields. Moreover, because the patterns on the photomask produced by this technique typically have a one-to-one correspondence with the original microlens array, this technique allows for convenient alignment between the photomask and the microlens array and also provides for the fabrication of a photomask with the array of patterns having the same arrangement as that of the original microoptical components with sub-micrometer or even sub-100 nanometer precision.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described. In the claims, all transitional phrases such as "comprising", "including", "carrying", "having", "containing", and the like are to be understood to be open-ended, i.e. to mean including but not limited to. Only the transitional phrases "consisting of" and "consisting essentially of" shall be closed or semi-closed transitional phrases, respectively.

The invention may be further understood with reference to the following examples. The examples are intended to serve as illustrations and not as limitations to the present invention as defined in the claims herein.

EXAMPLE 1

Microlens Array Fabrication

In this example, a microlens array 100 was prepared by embedding an array of spherically-shaped microoptical components 102 into a membrane according to the diagram shown in FIG. 1A. A silicon wafer 101 was cleaned before assembly of microlens array 100. A surface of the silicon wafer was activated or silanized by applying a thin film of polyfluorosilane, tridecafluoro-1,1,2,2-tetrahydrooctyltrichlorosilane, available from United Chemical Technologies, Inc., Bristol, Pa., to prevent adhesion of the PDMS to the wafer.

A solution of PDMS, SYLGARD® 184 silicone elastomer, available from Dow Corning Corp., Midland, Mich. in heptane, was prepared by adding the PDMS to heptane at a ratio of 1:5.1 by volume. This PDMS solution was spin-coated, about 1500 rpm, onto the silicon wafer to produce a uniform PDMS thin film 103 with a thickness (t) of about 3 µm on the surface of silicon wafer 101. PDMS film 103 was cured. The thickness of PDMS film 103 was controlled to be about the image distance of spherically-shaped microoptical components 102. The surface of PDMS thin film 103 was oxidized by exposing it to oxygen plasma for about 15 seconds to render the surface at least slightly hydrophilic.

An aqueous suspension of 3 µm diameter spherically-shaped microoptical components 102 was prepared using 3 µm diameter polystyrene beads. The beads are available from Polysciences, Inc., Warrington, Pa. The aqueous suspension of spherically-shaped microoptical components was then placed on the hydrophilized PDMS surface. A crystalline monolayer array of spherically-shaped microoptical components 102 was generated by allowing the water to evaporate, as described by, for example, Denkov et al. in *Langmuir*, vol. 8, page 3183, incorporated herein by reference.

The PDMS thin film and the array of organized layer of microoptical components were then exposed to oxygen plasma for about 15 seconds to oxidize the surface thereof so as to promote the adhesion of a second thicker layer of PDMS 105a. The second layer 105a was cast and cured over the thin film. PDMS layer 105 thus encapsulated spherically-shaped microoptical components 102 within a flexible support element 105a. To facilitate removal of support element 105, with embedded spherically-shaped microoptical components 102, the support element was peeled away from the silicon wafer while it was immersed in ethanol.

The resulting microlens array 100 had an area of about 2 cm×2 cm. The microoptical components of array 100 were encapsulated in flexible support element 105a at a distance t from surface 107a of support element 105 that was about equal to the image distance of microoptical components 102 with spacing element 103. The insert in FIG. 1A is a photocopy of a micrograph of a cutout of a microlens array that was fabricated according to the technique described; it shows a microlens array comprising polystyrene spheres embedded in a PDMS substrate A microlens array was also produced according to the previously mentioned "reflow" method. This method has also been described for other purposes by, for example, Popovic et al., in U.S. Pat. No. 4,689,291, by Tsumori, in U.S. Pat. No. 5,324,623, and by Robello et al., in U.S. Pat. No. 5,723,264, each incorporated herein by reference in their entireties.

Figure 1B:
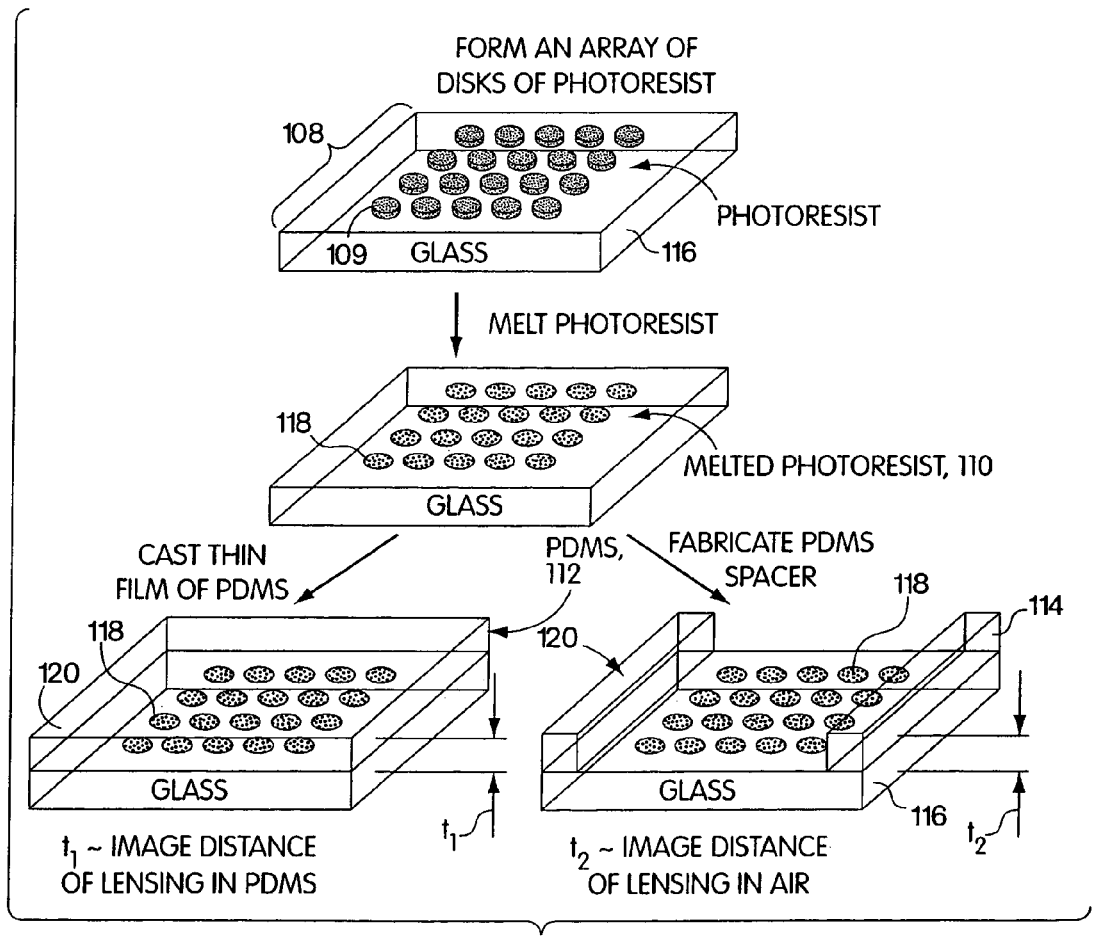

FIG. 1B shows the basic steps of the reflow technique. A transparent thin film of photoresist material, MICROPOSIT® S1800 Series photoresist, available from Shipley Company, L.L.C., Marlborough, Mass., was deposited on a glass substrate 116. Exposing the photoresist material to ultraviolet light through a mask (not shown) having a predetermined pattern generated the corresponding pattern of an array of disks 108. The unexposed regions of photoresist were washed away or otherwise removed leaving the semi-hardened or crosslinked light-exposed disk-shaped regions 109. The photoresist material was heated and melted, under controlled conditions, to change the shape of the photoresist material into plano-convex-shaped structures 110. A layer of PDMS, SYLGARD® 184, was then cast on and around plano-convex-shaped structures 110 and cured to form the spacing element 112. The assembled article thus formed a microlens array comprising plano-convex-shaped microoptical components 118. It is believed that the shaping of the microoptical components 118 results from forces associated with surface tension on the deposited material.

As shown in FIG. 1B, a spacing element was fabricated either by depositing a PDMS thin film 112 (bottom left) or by placing cylindrical spacing elements 114 at the periphery of support element 116 (bottom right). In both instances, the thickness of spacing element 112 or 114 was controlled so that microoptical components 118 were displaced, from a surface 120 of spacing element 112 or 114, by a distance about equal to their image distance. In preferred embodiments prior to melting the deposited material to form shaped optical components, a metallic thin film is deposited, such as by electroplating. The deposited material can be shaped, as by melting, and the deposited metal film removed therefrom while retaining the metal film deposited on regions without the optical components. The metal film can provide an aperture stop that can block transmission of incident illumination between the optical components thus providing a lens array that can be easily aligned with improved optical performance.

Figure 1C:
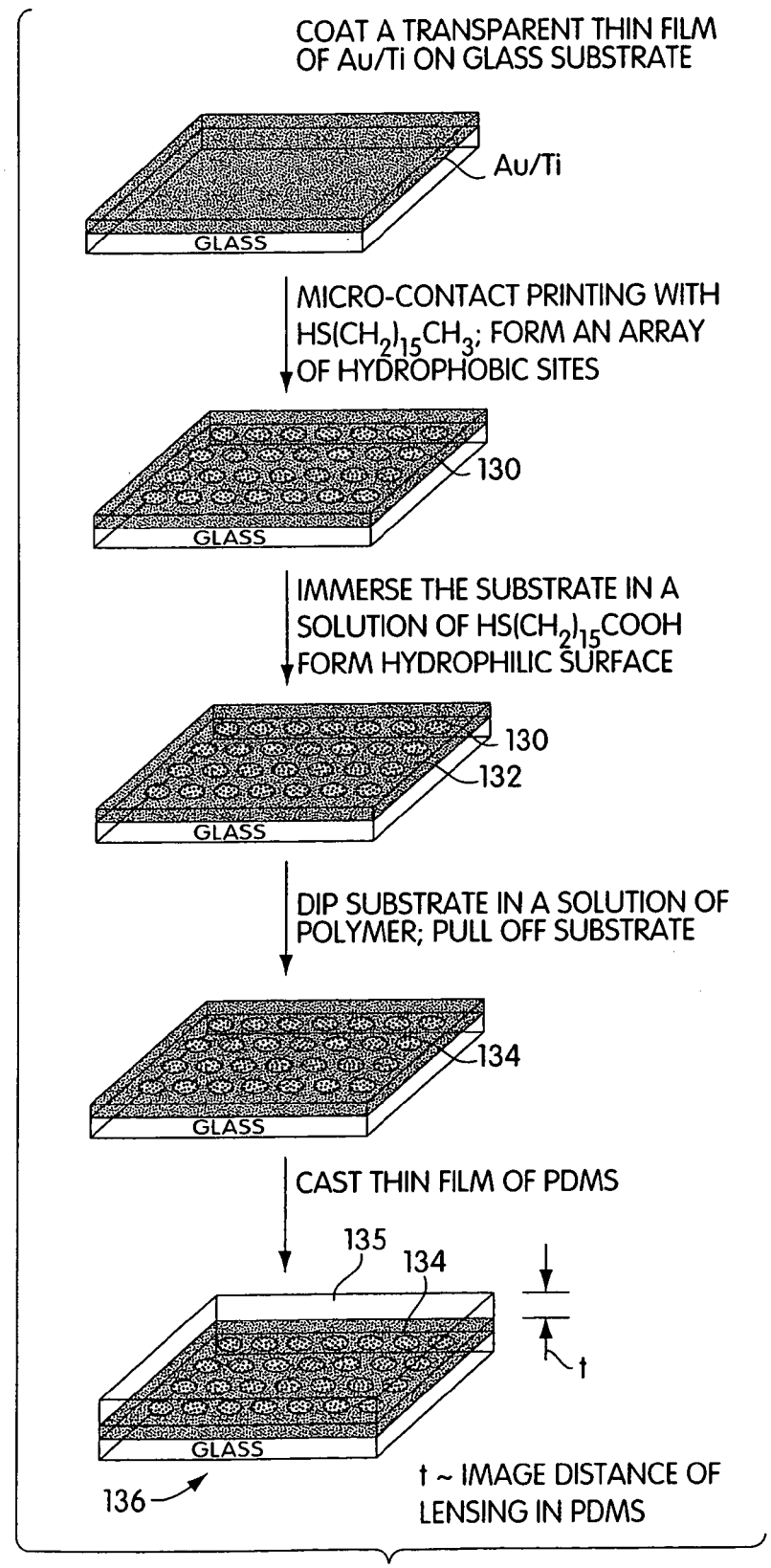

A device comprising an optical component was also produced according the "self-assembly" method. FIG. 1C schematically shows a flow diagram of this technique. A transparent metallic thin film, Au/Ti (2 nm Ti and 80 nm Au), was deposited on a glass substrate surface by evaporation. A flexible stamp made of PDMS (not shown) and having a predetermined patterned surface was inked or coated with HDT or $HS(CH_2)_{15}CH_3$ (1 mM). The stamp was placed in conformal contact with the Au/Ti-coated glass substrate thus depositing first hydrophobic SAM regions 130 corresponding to the pattern on the stamp. The gold-coated glass substrate was then coated with hydrophilic SAM by dipping the substrate in a solution of about 1 mM mercaptohexadecanoic acid, $HS(CH_2)_{15}COOH$, for about one minute. The substrate was slowly withdrawn from the immersion. After withdrawing, the substrate was cleaned in ethanol and dried by blowing nitrogen to form hydrophilic SAM region 132.

The dried, SAM-covered substrate was then immersed in MICROPOSIT® S1800 Series photoresist, available from Shipley Company, L.L.C., Marlborough, Mass. The photoresist material was selected so that it adhered preferentially to the hydrophobic SAM sites 130. In this way, an array of deposited photoresist material was created in a pattern corresponding to the stamping pattern. Surface tension around the photoresist material encouraged the photoresist material to form into a plano-convex shape. The photoresist material was then hardened into plano-convex-shaped microoptical components 134 by gently baking the substrate on a hot plate (not shown) at about 105° C. for about 15 minutes. PDMS spacing elements 135, with thickness essentially equal to the image distance of microoptical components 134, was cast on the glass substrate supporting the microoptical components. In this way, a microlens array 136 comprising plano-convex-shaped microoptical components, which were displaced at a distance (t) from a surface of the spacing element, was prepared.

Figure 1D:
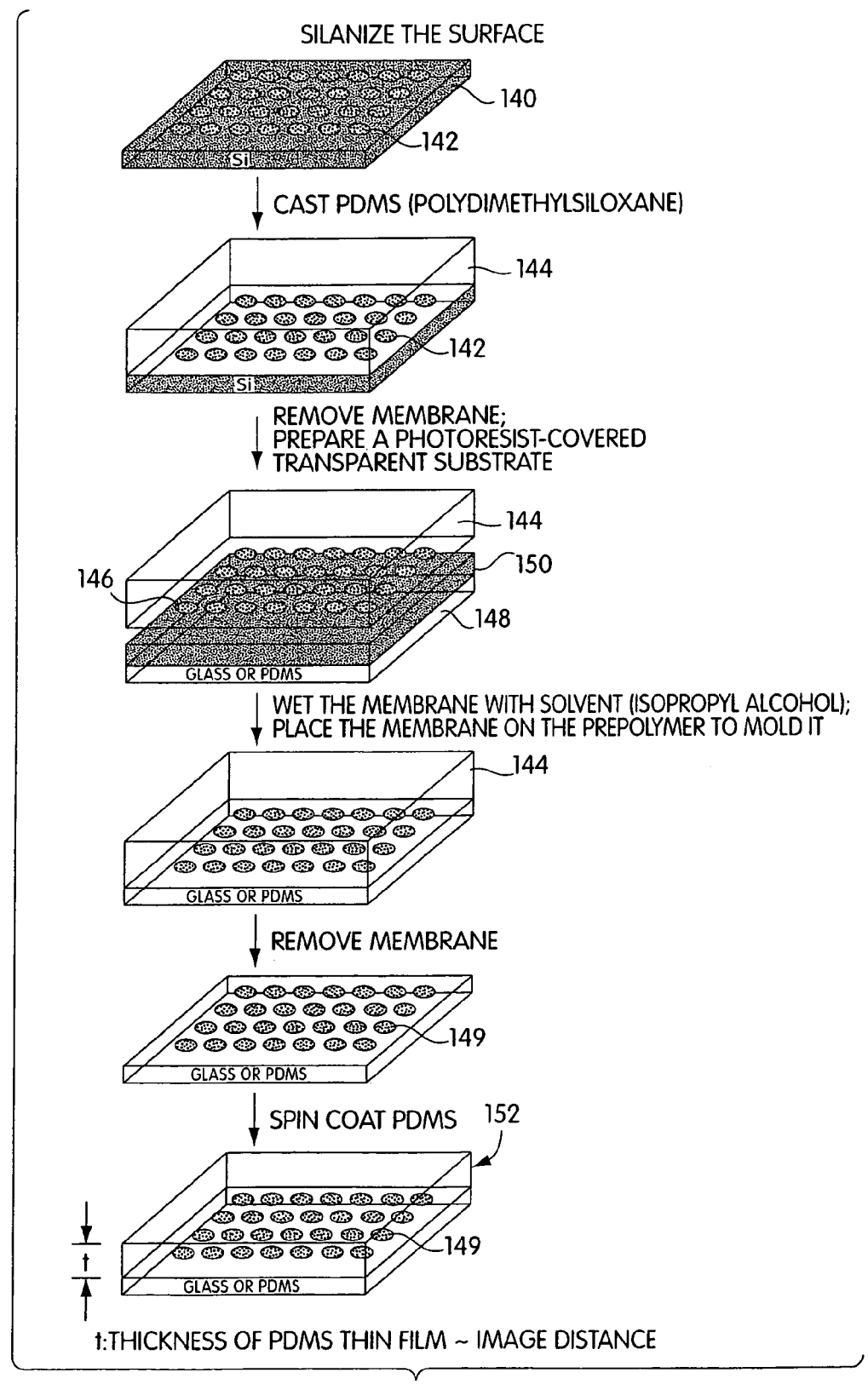

A microlens array was also prepared using the "molding technique." In this technique, shown schematically in FIG. 1D, a wafer 140 having plano-convex-shaped components 142 was silanized as described above. A PDMS membrane 144 was cast and cured on the silanized surface of wafer 140. After the polymeric membrane hardened, the membrane was removed from the silicon wafer. The resultant membrane 144, forming a mold, had indentations 146 corresponding to the shape and orientation of the original components 142 on the wafer.

Separately, a thin PDMS prepolymer film 100 was spin-coated on a glass substrate 148. Photoresist material, MICROPOSIT® S1800 Series photoresist, available from Shipley Company, L.L.C., Marlborough, Mass., was used. The mold was wetted with a solvent, isopropanol, and placed on the photoresist layer. The photoresist material was softened by the solvent to conform to the contours and features of the mold, including indentations 146, to form an array of plano-convex-shaped microoptical components 149. After removing membrane or mold 144, a PDMS layer 152 was coated over components 149 up to a predetermined thickness (t). The PDMS layer was cured to encapsulate microoptical components 149. The PDMS layer 152 was sized to have a thickness essentially equal to the image distance of the microoptical components 149.

A supplemental support element (not shown), which may have any desired shape or configuration, can then be cast and cured on the microoptical components if desired. The support element may be wedge-, rectangular-, cylindrically-, aspherically- and spherically-shaped.

EXAMPLE 2

Techniques for Creating Image Patterns on Surfaces

This example describes techniques used to create an image pattern on a surface; schematically shown in FIG. 2. A photoresist layer 105, MICROPOSIT® S1800 Series photoresist, specifically, 1805, available from Shipley Company, L.L.C., Marlborough, Mass., was deposited on an imaging substrate 180. The microlens array 100 produced according to Example 1 was placed in conformal contact with the photoresist-coated imaging substrate.

An optical projector (not shown) was used as a broadband light source 104. Light can be collimated, polarized and can have a selected wavelength such as ultraviolet light with λ about 365 to about 435 nm as in the present example. A pattern 182 was printed onto an object mask 184 using a desktop printer (not shown). Object mask 184 was placed on light source 104. Microlens array 100, with imaging substrate 180, was positioned at about 15 to about 25 cm above object mask 184 by adjusting the positioning stage of a Model MJB3 UV400 Karl Suss mask aligner (not shown).

For a photoresist layer with a thickness of about 200 nm, the light exposure time was set at about 1 to about 4 minutes, depending on the distance between the microlens array and the mask. After exposure, microlens array 100 was peeled from the exposed photoresist-coated substrate 180. The exposed photoresist material was developed in a diluted solution of SHIPLEY 351 sodium hydroxide, available from Shipley Company, L.L.C., Marlborough, Mass., diluted in a 1:5 ratio with 18 MΩ-cm water.

A LEO 982 FE-SEM microscope (not shown), available from LEO Electron Microscopy, Inc., Thornwood, N.Y., operating at about 1 keV was used to examine the surface topography of the developed substrates and generate the SEM micrographs thereof. The SEM micrograph photocopies in FIGS. 3A to 3C show various formed patterns corresponding to the particular patterns on the object mask utilized (shown in the inserts next to the micrograph photocopies). Note that the patterns on the object masks were generally reproduced on the corresponding substrate (although is greatly reduced size).

FIG. 3B shows that a negative mask, comprising a negative object pattern can be used in the same way as a positive mask (FIGS. 3A and 3C). FIG. 3C shows that an interconnected pattern can be fabricated using the techniques and system described herein.

The above-described lithographic technique produced patterns with a feature size reduction of greater than about 1,000 in a single step, e.g., exposure. The technique showed that patterns having, for example, sub-micron features could be produced using mask patterns with mm size features without the use of any intermediate image size-reduction steps. Furthermore, because the image distance of the microoptical components can be relatively short, the technique can produce less diffraction distortion when compared to conventional lithography. Finally, the technique demonstrates a low-cost alternative for generating high-density repetitive patterns with sub-micron resolution.

The distance between the object pattern and the illumination source, as well as the distance between the object pattern and the image substrate surface can be tuned beforehand using, for example, a precision optical system. In alternative embodiments to that shown, the position of the microlens array can be controlled by a precision optical stage to adjust the micro-images formed on the substrate. This system offers the advantage of producing a successive variation of the micro-images formed on the substrate by controlling the position of the microlens array.

Figure 9A:
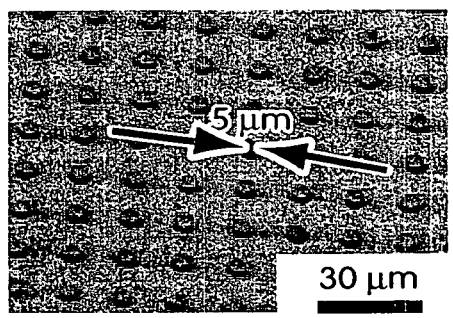
FIGS. 9A-9D are photocopies of micrographs of microoptical components fabricated using the reflow method provided by the invention and the self-assembly method provided by the invention.
Figure 9B:
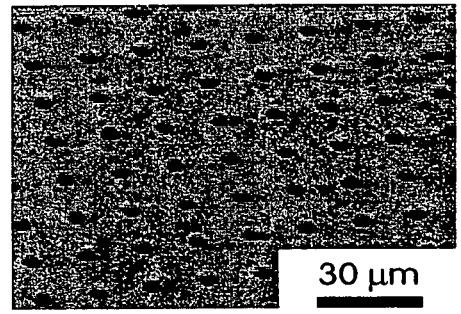

FIGS. 9A-9D show photocopies of SEM micrographs of microoptical components fabricated using the method and the self-assembly method similar to that described in Example 1. In particular, FIG. 9A shows an array of 5 µm diameter circular disks, before melting, made of photoresist material spaced with a distance separating disk center points of about 15 µm. The photoresist disks were melted on a hot plate, as described above in the context of the reflow method of Example 1, and developed a curved surface as is shown in FIG. 9B. After cooling, the photoresist material solidified resulting in an array of plano-convex microoptical components.

Figure 9C:
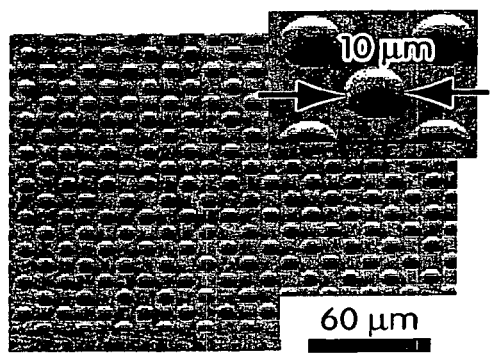
Figure 9D:
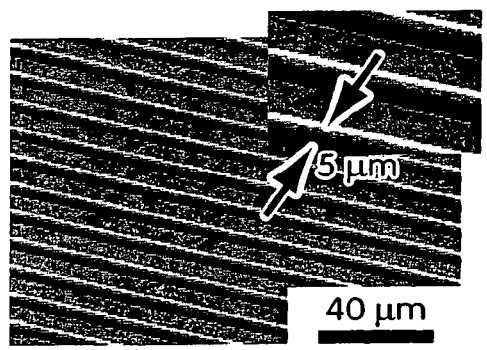

FIGS. 9C and 9D show photocopies of SEM micrographs showing microlens arrays comprising a square array of 10 µm plano-convex-shaped microoptical components and a 5 µm×5 µm array of lenticular or cylindrically-shaped microoptical components, respectively. These were prepared using the reflow melting technique as described above using a mask having an appropriately designed image. Specifically, with reference to the techniques described in Example 1, a glass substrate was coated with photoresist material and exposed to patterned UV radiation. The UV radiation effected a response on the photoresist material in the specific exposed regions.

The microoptical components were made of polystyrene having an $n_s$ of about 1.59, silica having an $n_s$ of about 1.39 and air having an $n_s$ of about 1. To create the latter, polystyrene microspheres were encapsulated and subsequently dissolved by sonication in acetone. Various-photoresist materials were used including, for example, MICROPOSIT® S1800 Series photoresist, available from Shipley Company, L.L.C., Marlborough, Mass., and specifically, MICROPOSIT® 1818 having an $n_s$ of about 1.7. The support element was typically made of PDMS having an $n_m$ of about 1.4. Finally, the glass substrates used had an n of about 1.37. The silicon substrates used were obtained from Silicon Sense, Inc., Nashua, N.H.

EXAMPLE 3

Fabrication of Microlens Arrays with Microoptical Components Exposed to the Surrounding Atmosphere This example involved the fabrication of a microlens array comprising microoptical components exposed to a surrounding atmosphere such as air or a gas or a medium that has an index of refraction of about 1. A microlens array was first fabricated on a transparent substrate as described in Example 1. An array of photoresist post was then fabricated by depositing photoresist material, MICROPOSIT® S1800 Series photoresist, available from Shipley Company, L.L.C., Marlborough, Mass., on the microoptical components using, for example, the self-assembly method described above. That is, hydrophobic SAMs were deposited on the microoptic component. The substrate was then dipped in a solution of hydrophilic SAM solution to coat the remaining regions. Photoresist material was then applied which preferentially deposited on the hydrophobic SAM regions after developing using conventional techniques, the unexposed regions were removed. The glass substrate was heated causing the partially cured photoresist to melt and flow into the shapes shown in the figures. A PDMS transparent substrate was then cast on the microlens transparent substrate and around the photoresist posts. The thickness of the transparent medium was controlled to approximately equal the focal length or image distance of the microoptical components. The photoresist posts were then dissolved away using conventional solvents, thus producing a microlens array with microoptical components on a transparent substrate with a transparent layer surrounding cylindrically-shaped apertures filled with the surrounding environment (e.g., air) adjacent microoptical components.

In another technique, an array of photoresist posts was first patterned on a transparent substrate. The substrate with the photoresist material was then deposited in a solution of high refractive index polymer material thus surrounding the posts. The polymer material was cured to form microoptical components around the photoresist posts. A transparent medium was then cast on the substrate to encapsulate the microoptical components and photoresist post array. The photoresist post materials were then dissolved away leaving an array of microoptical components in a transparent medium and having cylindrical holes or apertures or hollow portions.

EXAMPLE 4

Formation of Multi-Layer Patterns with Microlens Array Projection Lithography

This example describes a microlens array projection lithographic technique in the fabrication of multi-layer patterns. An array comprising microoptical components was used to project the image of an object on an illuminated mask to generate a corresponding array of images on a common image plane.

The array of microoptical components was fabricated according to the techniques described in Example 1. Projection lithography was used, as described in Example 2, to generate an array of patterns on a photoresist layer. After exposing and developing the photoresist layer, a first array of patterns was formed. An overhead transparency projector was used as the light source, and the optical component in contact with the layer of photoresist material was placed at a distance about 15-25 cm from the light source. The mask used for this technique was placed directly on top of the light source. Depending on the specific pattern on the mask used, the mask distance, the distance between the mask and the microlens array, and the light source, the exposure time ranged from about 1 to about 4 minutes. The multi-layer pattern produced by this technique was transferred to an elastomeric membrane using soft lithograph techniques, such as molding.

To fabricate a second-layer or second arrangement of patterns, a second photoresist layer was deposited over the first-layer pattern. Projection lithography was then used to generate an array of patterns on the second photoresist layer in a similar fashion to that described above. After using the lift-off technique, as described above, with a thin film of oxides, a second-layer pattern was produced on the first-layer pattern.

A second pattern can be used to generate a shifted second image pattern, which would be superimposed on the first image pattern, to thereby fabricate a composite pattern of structures having features that correspond to those of the first image pattern and a shifted second image pattern, in relative position to the first image pattern. In some cases, the first and second patterns were identical thus resulting in the fabrication of a composite pattern or structure without the complications associated with the use of multiple masks. Positional shifting can be done by, for example, displacing or moving the substrate relative to the mask before the second exposure.

EXAMPLE 5

Formation of Uniform Micropatterns

Figure 5A:
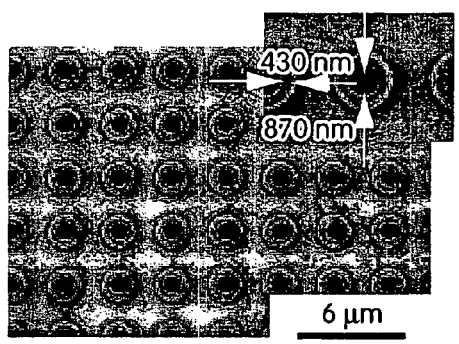
FIGS. 5A-5D are photocopies of micrographs showing image patterns fabricated using the microlens arrays shown in FIGS. 4A-4D.
Figure 5B:
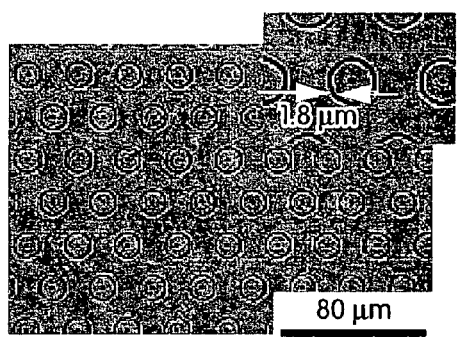
Figure 5C:
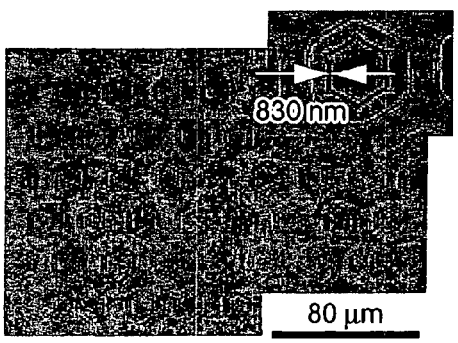
Figure 5D:
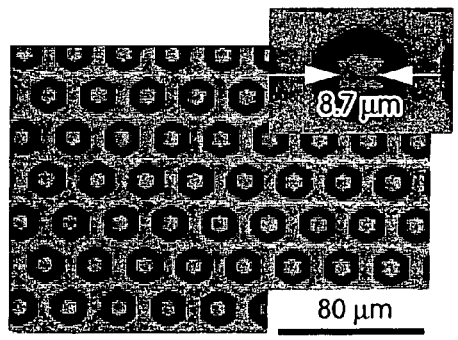

Microlens arrays, under flood illumination, were used to fabricate uniform micropatterns over essentially the entire illuminated area, which was greater than 10 cm². FIGS. 4A-4D are photocopies of SEM photomicrographs of microlens arrays fabricated using the techniques substantially as described in Example 1. Using the techniques substantially as described in Example 2, patterns were fabricated using these microlens arrays, copies of which are shown in FIGS. 5A-5D. Specifically, FIG. 5A was produced using the 1.5 μm lenses shown in FIG. 4A and FIG. 5B is a photocopy of an SEM micrograph showing a hexagonal array of structures produced using the lens array as shown in the copy shown in FIG. 4D. The pattern shown in the photocopies of FIGS. 5C and 5D were produced using the lens array shown in the copy in FIG. 4C exposed for 1.5 seconds and 5 seconds, respectively. The comparison of these two patterns demonstrates that the shapes of the micropatterns can be controlled by the exposure dose.

EXAMPLE 6

Production of 3D Patterned Photoresist Surfaces

In this example, various patterned photoresist surfaces were prepared having different 3D patterns thereon. FIG. 6 schematically illustrates the method for the formation of the 3D patterns or structures using a microlens array comprising spherically-shaped microoptical components 204 embedded in a support element 205. FIG. 7 schematically illustrates an alternative technique employed for producing structures using a microlens array comprising a layer of microoptical components positioned at a distance (t) from the imaging substrate. As shown schematically in FIGS. 6 and 7, a substrate having a photoresist layer deposited thereon can be exposed to UV radiation through a microlens array, comprising microoptical components, in contact with a surface of the photoresist layer. The microptical components 204, can diffract the incident radiation thereby concentrating, at least partially, on a preferred region. Controlled exposure can be used to vary the response of the photoresist material. Specifically, regions of photoresist material having higher relative UV exposure can be easier to remove compared to regions with less intense UV radiation exposure. FIG. 7 shows that by varying the distance between the microoptical components and the photoresist material, the concentration or intensity of UV radiation can be controlled, which can correspond to relative amounts or areas that can be removed. The microoptical components can be displaced by incorporating "well-like" cavities (not shown) or casting a spacing element as described above. Depending on the relative index of refraction between the optical components and the adjacent medium and on the wavelength of the incident illumination, incident illumination can be caused to converge or even diverge.

EXAMPLE 7

Microoptic Array Lithography

This example describes and shows various patterns and structures fabricated on a substrate using microoptic array lithography. A microlens array fabricated substantially as described in Example 1 was used to perform projection lithography substantially as described in Example 2. This example demonstrates the fabrication of diffraction elements and arrays of microoptical components. A microlenses array combined with gray-scale projection lithography, can produce a corresponding array of microstructures having three-dimensional profiles controlled by the transmissivity of the gray-scale patterns of the photomask used. These arrays of microstructures can perform a range of different optical functions including, but not limited to, diffraction of incident coherent illumination, depending on, among other things, the period and the profile of the microstructures. With appropriate surface profiles and coatings, these microstructures can act as microlenses or micromirrors and can be used to generate arrays of images. In some cases, diffraction gratings and microoptical components with features that are uniform over areas greater than about 10 cm² in a single exposure can be fabricated.

Arrays of optical components have been produced by previously described methods, including, for example, conventional photolithography, laser pattern writing, photography, plastic molding, interference lithography, ion-beam lithography, X-ray lithography, and conventional gray-scale lithography. Although these methods can produce uniform elements with controlled surface profiles, they typically require expensive equipment, for example, mask aligners and/or laser optical systems and/or templates such as master molds or gray-scale photomasks with sub-micrometer resolution. Some of these techniques, such as laser pattern writing and photography, produce microelements with limited resolution (e.g., greater than 1 μm) and they typically cannot control the surface relief features with sub-micrometer resolution. Techniques such as interference lithography can produce microstructures but sizes, periods, and arrangements are strictly limited by the incident wavelengths and angles.

The profiles of the microstructures fabricated according to the present technique can be modified by adjusting the shapes and gray-level distribution of the patterns on transparency masks and, with appropriate profiles or coatings, can act as diffraction elements and/or imaging arrays.

In this example, the remelt or reflow method described in Example 1 was used with photoresist material, MICROPOSIT® S1800 photoresist (for thickness of resist less than about 3.5 μm) or MICROPOSIT® SJR 5000 photoresist (for thickness of resist greater than about 3.5 μm) (both available from Shipley Company, L.L.C., Marlborough, Mass.) to generate the microlens arrays. A transparent metallic thin film, 12 nm Au on 3 nm Ti, was coated on a glass substrate by, for example, electroplating, upon which an array of disks of photoresist material was deposited. The height of the deposited photoresist material was about 10-20% of the diameter of the photoresist disk structures. A metallic thin film layer of about 200 nm thick of copper was electroplated thereon using a solution for copper electroplating, for example, TECHNI COPPER U, available from Technic Inc. The coated substrate was placed on a hot plate and the photoresist material was heated and melted at about 180° C. for about 15 minutes. The reflow of melted photoresist material formed curved, smooth surface profiles under, it is believed, the influence of surface tension. Slow cooling of the substrate, at about 15° C./minute, allowed the photoresist to harden while preserving its smooth surface. Upon melting, the thinly-deposited copper film was removed from the microoptical components. This method generated arrays of lenses of between 1 μm and 1 mm, and with either circular or noncircular profiles. The electroplated copper film formed an aperture stop that blocked the transmission of incident illumination through the areas between the subsequently formed microoptical components, which tended to prevent the fogging of the images produced in the photoresist material. Fogging can result from exposure of incident illumination in the regions corresponding to those between the microoptical components.

The microlens array was then encapsulated with a transparent PDMS spacer having a thickness approximately equal to the focal length of the lenses. Because the gray-scale mask was located at a distance far away from the lens array ($D_{mask} \gg r_{microlens}$), the image distance of the lenses in the array was about the same as their focal length, since imaging occurred through the transparent spacer. To fabricate the spacer, a thin film of PDMS, SYLGARD® 184 available from the Dow Corning Corp., Midland, Mich., was spin-coated onto the lens array. For an array of 10 μm lenses with a numerical aperture about 0.25, the thickness of the PDMS spacer was controlled to be about 20 μm. A spacer of this thickness was produced by spin coating a mixture of PDMS and heptane (PDMS : heptane=4.5:1) at 1500 rpm.

To perform photolithography, a transparency mask, with the designed gray-scale pattern, was placed between a light source, either an overhead transparency projector or a UV lamp, and the resist-coated silicon substrate, which was in contact with the lens array embedded in its compliant PDMS layer. The photoresist material used was MICROPOSIT® S1800 and SJR 5000 photoresist at a thickness of 1-5 μm. A diffuser, such as a piece of ground glass, was placed in front of the light source to produce uniform illumination. The exposure time was from about 10 seconds to several minutes, depending on the minimum feature size on the mask and the depth of the microstructures desired. The smaller the feature size, the longer the exposure time; the larger the distance of the mask from the lenses, the longer the exposure time. The profile of the microstructures in the photoresist material is in general a nonlinear function of both the exposure time and the gray-scale distribution of the pattern on the mask.

These initial microstructures were then used as molds to fabricate complementary PDMS replicas. These replicas, prepared as 3 mm thick membranes, acted as elastomeric optical components such as imaging arrays and diffractive elements, depending on their surface profiles. A thin film of gold, about 50 nm thick, was deposited on some of the surfaces of the elements, so that they functioned as reflection-mode optical components (i.e., micro-mirrors).

The lithographic techniques as described above can be used to fabricate various types of optical components: (i) arrays of refractive microlenses, (ii) arrays of micromirrors, (iii) arrays of diffractive microlenses, (iv) diffraction gratings, and (v) beam splitters.

This technique can also be used to fabricate binary micromirror optical components. For example, an array of 40 μm circularly-shaped lenses with a 50 μm pitch and an NA of about 0.125 can be used to fabricate an array of microwells.

Figure 11A:
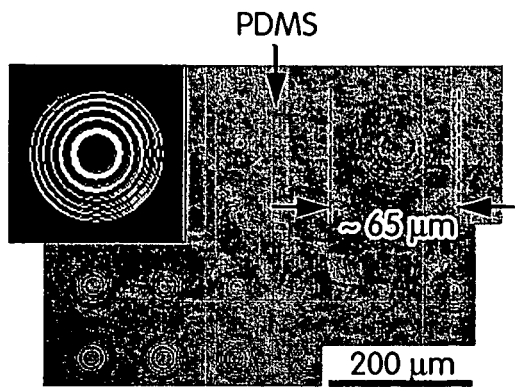
FIGS. 11A-11K are photocopies of micrographs showing arrays of multi-step diffractive lenses produced using multi-gray-level masks according to certain embodiments of the invention.
Figure 11D:
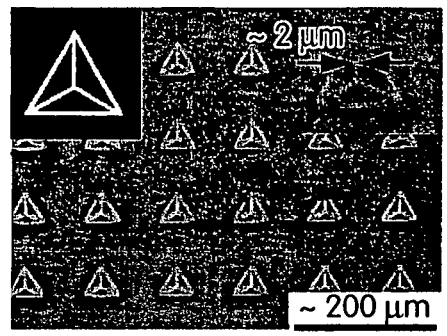
Figure 11B:
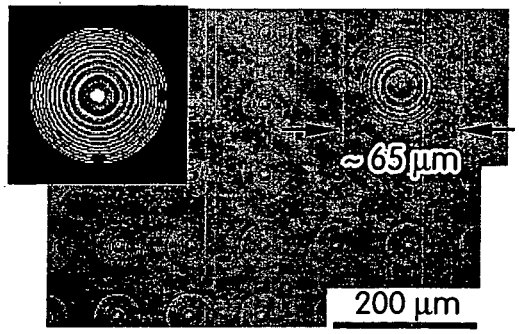
Figure 11E:
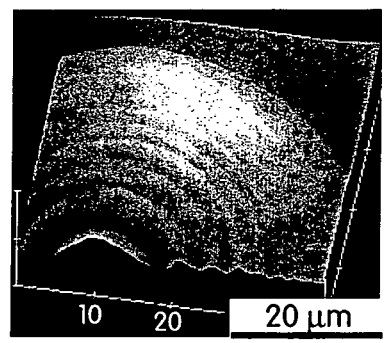
Figure 11C:
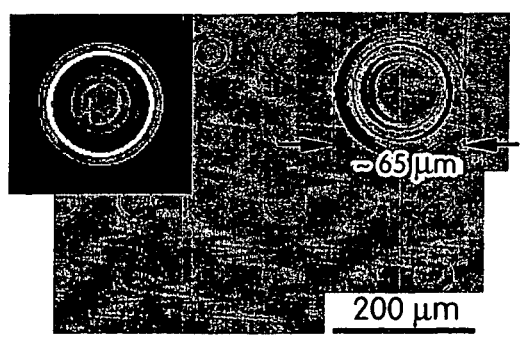
Figure 11F:
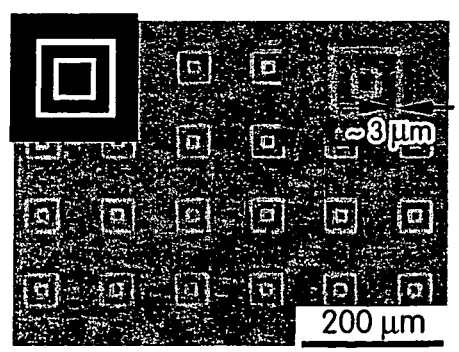

FIGS. 11A-11I are photocopies of SEM micrographs showing arrays of multi-step diffractive lenses produced using multi-gray-level masks (inserts). These figures demonstrate that the techniques described can produce multi-step microstructures that can function as optical imaging elements. FIG. 11E is a copy of an AFM image of a section of the microlens array shown in FIG. 11B.

Figure 11G:
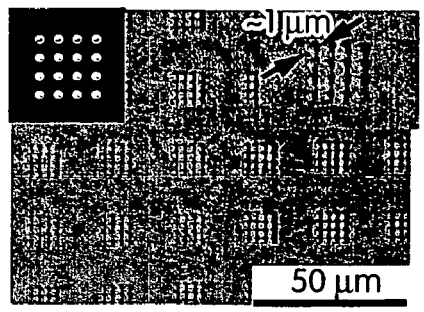
Figure 11J:
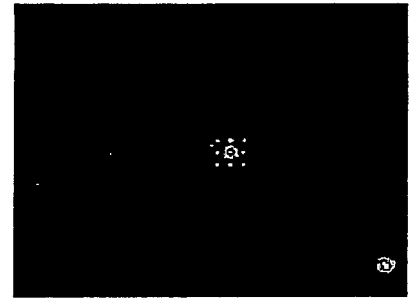
Figure 11H:
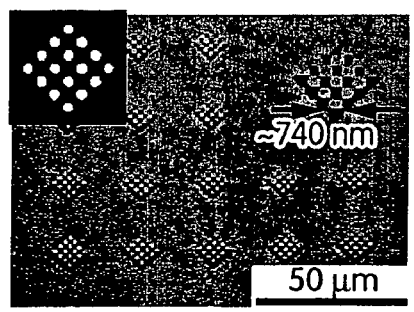
Figure 11K:
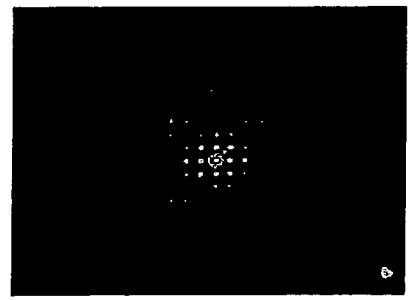
Figure 11I:
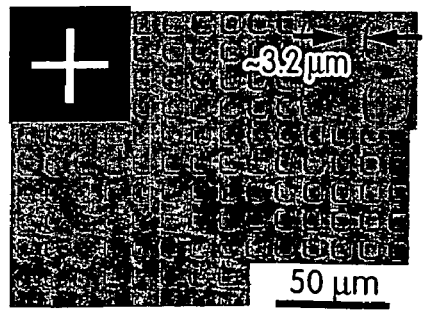

FIGS. 11G and 11H show the surface profiles of two diffractive elements produced using an array of 10 μm diameter circular lenses. These two elements have the same period, about 15 μm, and the same pattern of microstructures, a 4×4 square array of circular dots. FIG. 11I demonstrates that the techniques described herein can provide a route for the fabrication of optical gratings without the use of high-precision optical or mechanical facilities used in conventional methods. FIGS. 11J and 11K show the diffraction patterns of the corresponding arrays shown in FIGS. 11G and 11H, respectively, produced using incident illumination from a He—Ne laser, λ=632 nm. As shown, both elements can act as beam splitters. These patterns demonstrate that microlens lithography can modify the surface profiles of diffraction gratings and beam splitters, and thus modulate the distribution of intensity of arrays of spots produced by these elements.

EXAMPLE 8

Microlens Arrays Embedded in a Wedge-shaped Support Element

Figure 10:
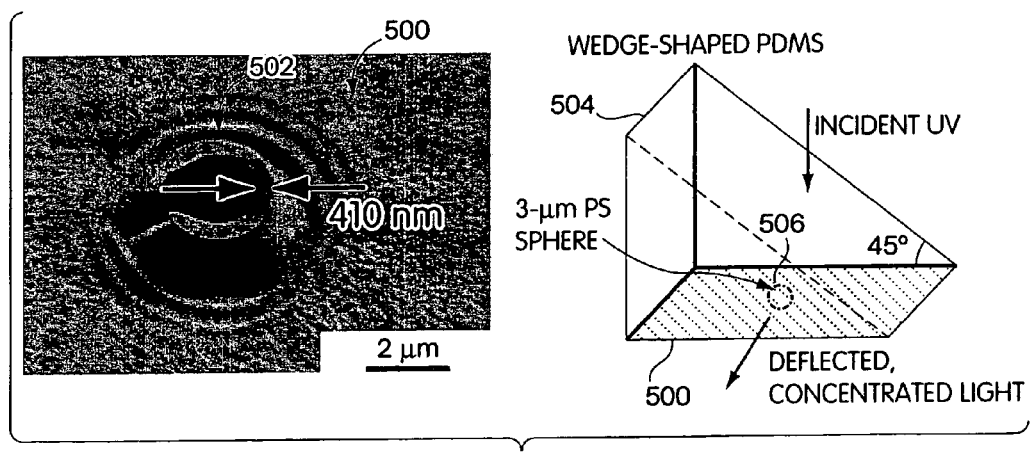
FIG. 10 is a photocopy of an micrograph (left) of a substrate surface with structures thereon that were generated using a schematically shown microlens array (right) comprising a spherically-shaped polystyrene microoptical components embedded in a 45-degree wedge-shaped PDMS support element.

FIG. 10 is a photocopy of an SEM micrograph (left) of substrate surfaces 500 with structures 502 thereon that were generated using a microlens array comprising a spherically-shaped polystyrene microoptical component (right) embedded in a 45-degree wedge-shaped PDMS support element 504 prepared by depositing the polystyrene microoptical component on a substrate and encapsulating it with PDMS. The assembly was cured at an angle to create the wedge-shaped microlens array. The horseshoe-shaped structure 502 shown in FIG. 10 was generated using the schematically illustrated wedge-shaped microlens array comprising a 3 μm diameter microoptical component 506 embedded therein, using the lithographic techniques described above as described in the context of Example 2. The structure shown in FIG. 10 (left) had non-circular, regular features. It is believed that the wedge shape of the PDMS support 504 caused deflection of the incident illumination, thus altering the direction of incident light therethrough. Notably, a plurality of optical components supported in any geometrically shaped support element with non-planar surfaces can potentially be used to generate a pattern or structures to deflect or alter the incident illumination. Further, the angle of the incident illumination can be varied, relative to the lens array, to further control the pattern or features fabricated on a substrate.

EXAMPLE 9

Fabrication of Arrays of Microstructures with Controlled 3D Topography Using Gray-scale Masks Arrays of microstructures with a controlled, 3D topography were fabricated using microlens projection lithography, as similarly described in Example 2, and gray-scale masks. Transparencies of about 20 cm×20 cm were used as the masks. The object patterns on transparency masks were printed at a 3840 dpi resolution using a desktop printer, as those skilled in the art would be capable of creating. Computer aided design application, FREEHAND 10 software, available from Macromedia Inc., San Francisco, Calif., was used to design the patterns on the masks. The software provided 100 gray levels, from 0% of full transmission to 100% of full opacity. These gray-scale patterns had lateral dimensions of about 10 cm and sub-20 μm resolution in the gray-scale levels.

The depth of features produced in the photoresist substrate by gray-scale microphotolithography was nonlinearly proportional to the gray level of the pattern on the transparency mask. To minimize this nonlinearity, the gray-scale intensities on transparency masks can be used to control profiles of exposed and developed photoresist material. This compensation technique is believed to be similar to that used in contact-mode gray-scale photolithography. The intensity of the micro-images produced by each microlens depends on the shape and gray-level distribution of the pattern on the mask, the distance of the mask from the lens array, the numerical aperture and the aberration of the lens, and the irradiance distribution of the light source. For a fixed light source and a constant distance of the mask from the lens array, one can adjust the distribution of intensity in the projected, focused micro-images-by adjusting the gray-level transmissivity of the pattern on the transparency. Using this procedure, the profile of the microstructures generated in photoresist material was controlled.

Two types of microlens arrays were fabricated and used: (i) 2D crystals of self-assembled transparent spherically-shaped microoptical components embedded in PDMS and (ii) arrays of plano-convex microoptical component fabricated on glass substrates, both described in Wu, M. H. et al., "Fabrication of arrays of two-dimensional micropatterns using microspheres as microlenses for projection photolithography," *Appl. Phys. Lett.*, v. 78, pp. 2273-2275 (2001) which is incorporated herein by reference in its entirety.

The microlens arrays were placed in contact with a layer, about 1 to about 10 μm of photoresist material supported on a silicon substrate. Depending on the NA of lenses, the distance of the mask from the lens array, the intensity of the illumination, and the minimum size of features on the mask, adequate exposure required tens of seconds to several minutes. This can easily be determined by routine experimentation and optimization. An overhead transparency projector was used as a light source, with a transparency film on top of the Fresnel lens of the projector. A diffuser such as ground glass was placed in front of the light source to produce uniform illumination. To increase the efficiency of exposure, the diffuser was placed in front of the lamp rather than on top of the Fresnel lens. The distance between the transparency and the lens array was about 40 to about 60 cm.

After exposure, the substrate was removed from the microlens array and developed in a solution of sodium hydroxide. Since we used positive resist for the experiments, a transparent slit on the mask produced a groove in the exposed and developed resist. The profile of the groove depends on the gray-level distribution of the slit on the mask.

The array of microstructures fabricated in the photoresist material was passivated by silanizing using tridecafluoro-1, 1,2,2-tetrahydrooctyltrichlorosilane. This photoresist layer was then used as a master for molding microlenses. PDMS, at a thickness of about 5 mm, was cast on this topographically patterned photoresist layer and cured in an oven at 60° C. for about 1 hour. An NANOSCOPE® IV atomic force microscope (AFM) (available from Digital Instruments, Veeco Metrology Group, Santa Barbara, Calif.) was used in tapping mode to characterize the surfaces and produce the surface images and profiles of the samples. An optical microscope (Leica Model DMRX microscope, available from Kramer Scientific Corp., Valley Cottage, N.Y.) was used to characterize the lensing of the resulting non-circular microlenses under white-light illumination. The optical patterns were recorded using a DXC-960MD CCD video system, available from the Sony Corp., Japan.

Figure 12A:
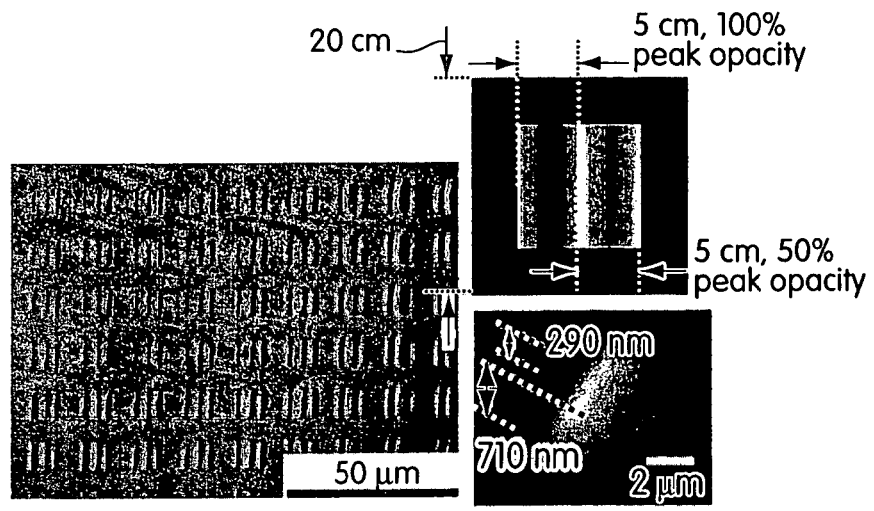
FIGS. 12A-12C are photocopies of micrographs of PDMS microstructures produced using different gray-scale transparency masks.
Figure 12B:
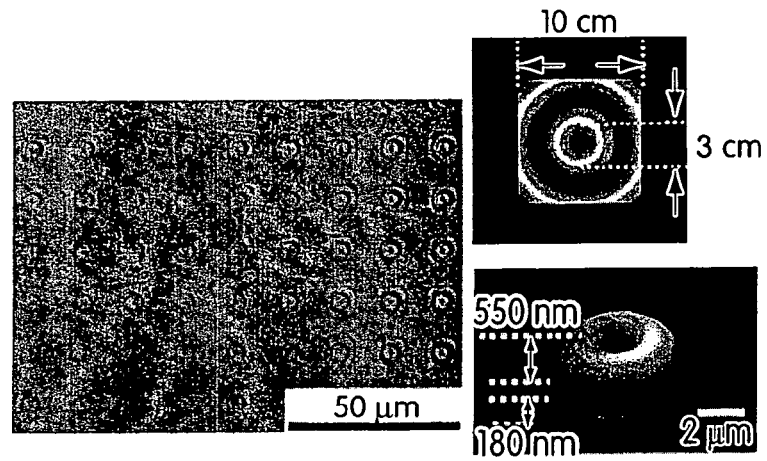
Figure 12C:
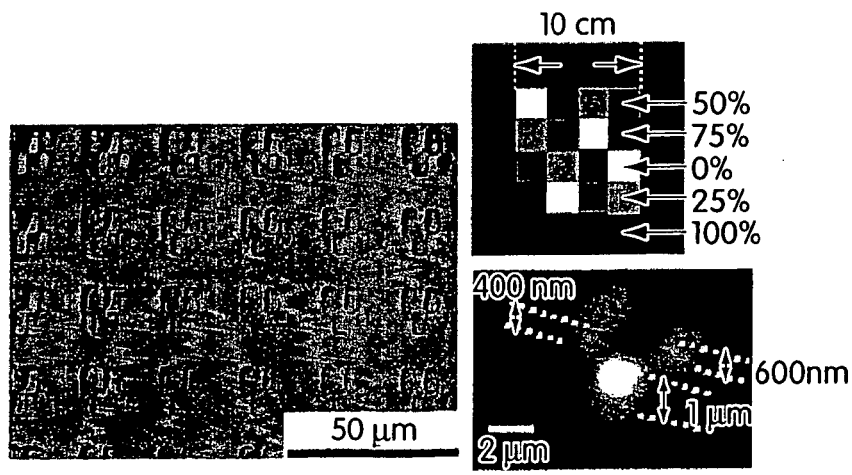

FIGS. 12A-12C are photocopies of AFM micrographs of PDMS microstructures produced using different gray-scale transparency masks using replica molding techniques as described in Example 1. The masks are shown at the upper right corners of the corresponding figures. The mask shown in FIG. 12A had a pattern of two lines of the same width but with different linear gray-scale gradients. The peak opacities of the two gradient lines were 100% and 50%, respectively. The AFM micrograph shown in the inset (lower right) showed a difference in the profiles of the gradient lines due, it is believed, to the difference of gray-level distribution. The two peak opacities produced two wavy microstructures with amplitudes of 710 nm and 290 nm, respectively. This also demonstrated the nonlinear relationship between the opacities on the masks and the amplitudes of microstructures produced.

FIG. 12B is a photocopy of AFM photomicrographs of the microstructures in PDMS produced by the mask shown in the insert (top right), which had two concentric circular rings with 100% peak opacities. The profile of the microstructures was similar to that on the mask. Although the peak opacities and the widths of the two rings were about the same, the AFM image shown in the inset (lower right) indicates a significant difference between the amplitudes of the two concentric rings: the inner ring had an amplitude of about 550 nm and the outer ring had an amplitude of about 180 nm. The bottom of the central cavity was about 410 nm higher than the flat area outside of the microstructure, while the circular trench was about 300 nm higher than the same reference plane because, it is believed, incident radiation was more out-of-focus toward the peripheral areas.

FIG. 12C is a photocopy of a AFM micrograph showing an array of microstructures on PDMS produced using a mask having a 4×4 gray-scale pixel array (top right). Each microstructure consisted of a multi-step 4×4 pixel array. Each row or column in the pixel array was produced by four different gray-level pixels on the mask: 0%, 25%, 50%, and 75% opacities. The background had 100% opacity. The copy of the AFM insert (lower right) showed that the depth of each step was nonlinearly proportional to the opacity of the corresponding pixel on the mask.

Figure 13A:
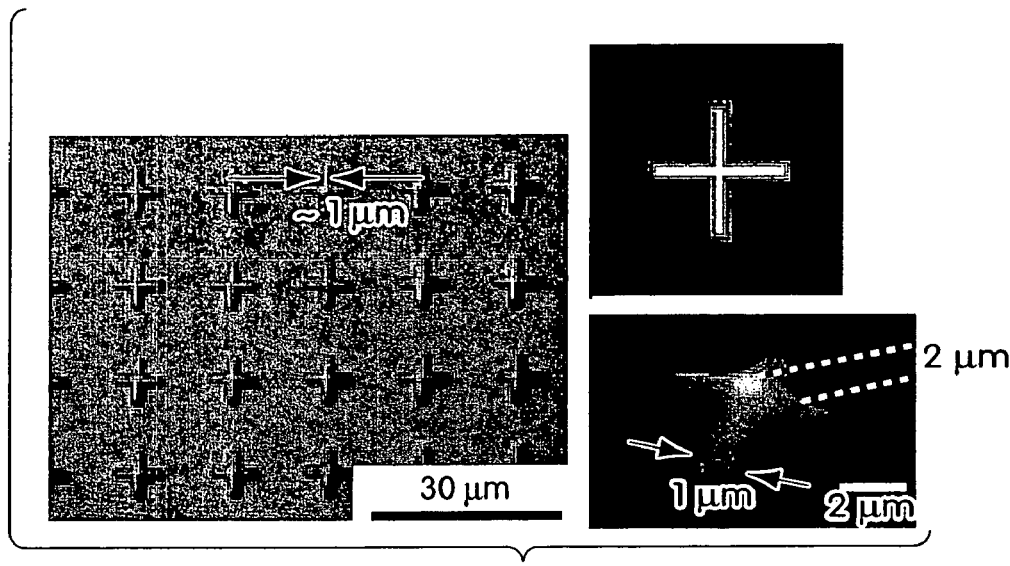
FIGS. 13A-13F are photocopies of micrographs showing arrays of cross-shaped microoptical components produced using masks with cross-shaped patterns.
Figure 13B:
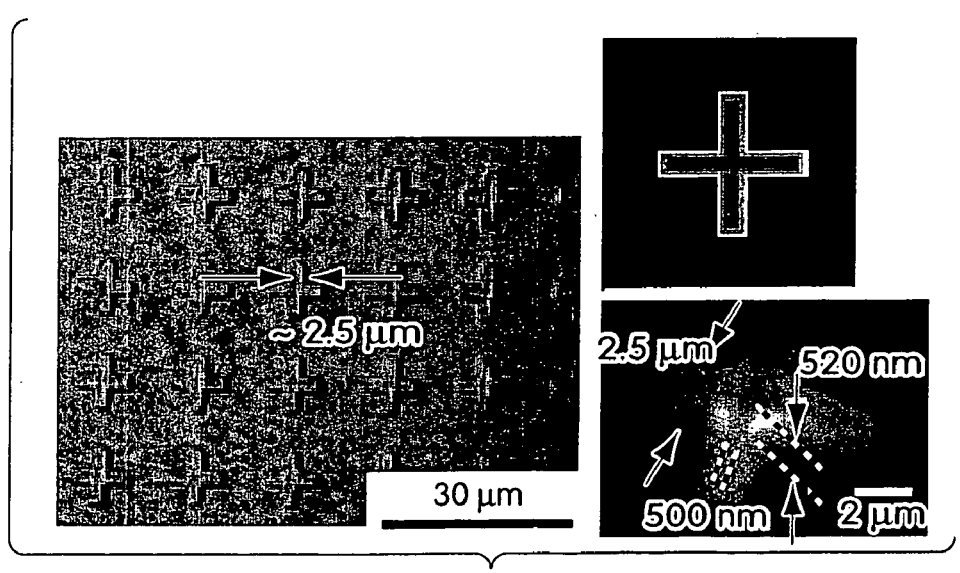

FIGS. 13A and 13B are photocopies of AFM micrographs showing arrays of cross-shaped microoptical components produced using gray-scale masks with cross-shaped patterns (top right). Replica molding techniques, as described above, were used to fabricate the cross-shaped PDMS microlenses. Each cross-shape pattern consisted of five cross-shaped frames with different gray steps. The mask shown in FIG. 13A had a gray level distributions of 80%, 60%, 40%, 20%, and 0% going from the outermost frame to the innermost one. This gray distribution was used to generated microoptical components with a sharp center profile.

Figure 13C:
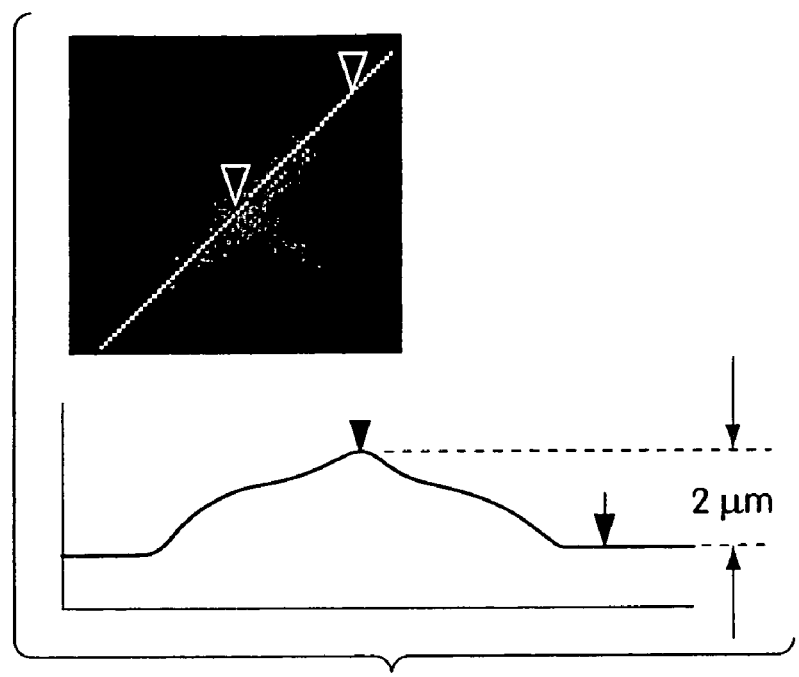
Figure 13D:
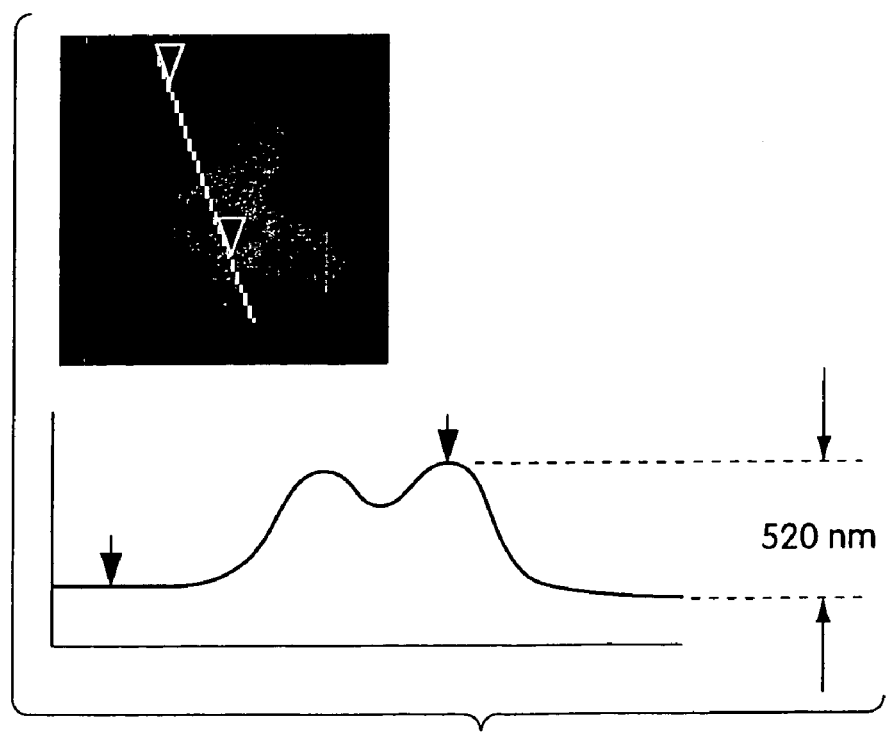

The masks shown in FIG. 13B also had five gray level distributions, 0%, 20%, 40%, 60%, and 80%. The central dark, gray level distribution, frames in the second mask generated a U-shaped dip in the profile of cross-shaped microoptical components as shown in the copy of the AFM insert (FIG. 13B—lower right). The gray distribution of the mask used in FIG. 13A was brightest in the center of the cross pattern and produced optical components with reduced linewidth, about 1 μm, and greater height, about 2 μm, while the gray distribution of the mask used in FIG. 13B was used to fabricate non-circular optical components with greater linewidth, about 2.5 μm and lower height, about 520 nm. The cross-sectional profile details of each of cross-shaped lenses are shown in FIGS. 13C and 13D, respectively. This example demonstrated that gray-scale masks can be used to fabricate and modify microlenses with controlled profiles at submicrometer resolution.

Figure 13E:
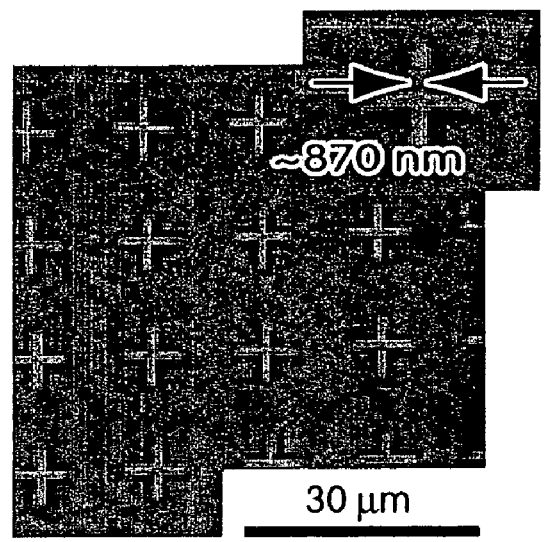
Figure 13F:
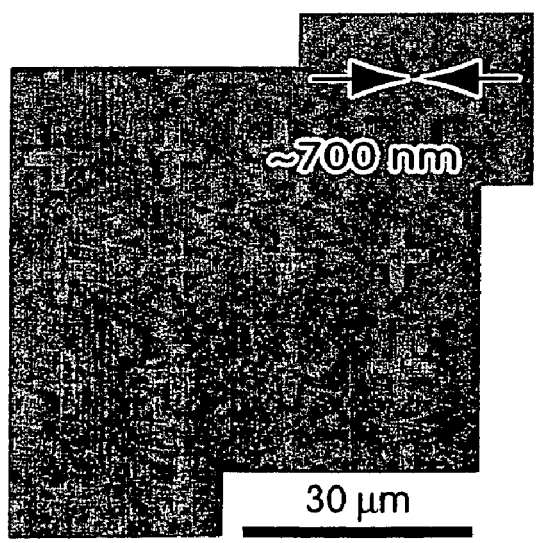

The microoptical components shown in FIGS. 13A and 13B were subsequently used to produce focused image pattern and perform microlens projection lithography. A microscope was used to provide illumination through the cross-shaped microoptical components of FIGS. 13A and 13B, and onto photoresist surfaces to fabricate the patterns shown in the photocopies of SEM micrographs of FIGS. 13E and 13F, respectively. The produced patterns had features having dimensions of about 300 nm to about 2 μm. These images demonstrated that the microlenses produced by masks with different gray-level distribution could generate different optical patterns on their focal planes.

EXAMPLE 10

Fabrication of Frequency Selective Surfaces (FSS)

Arrays of metallic patches can act as conducting dipoles upon illumination with electromagnetic radiation. The arrays can act as spectrally resonant components, and can function as spectral filters. For these elements to filter in the mid-infrared spectrum, the length of the conducting dipoles should have dimensions from 1.0 to 4.0 μm.

This example demonstrates a method for the fabrication of FSS using microlens projection lithography. This technique can generate arrays of patterns with features smaller than 300 nm using broadband illumination with wavelength ranging from 350-450 nm, and can provide a reduction of pattern size over $10^3$ in a single step. This technique can eliminate the use of a stepper in certain circumstances, and has the potential to be particularly useful for large—In the present example, microlens projection lithography was used to fabricate a FSS consisting of arrays of microscale crosses or tripoles wherein the length of each arm was about 2 to about 4 μm. The linewidth of each was about 0.5 to about 1 μm. The frequency selective filters were fabricated on substrates of crystalline ZnSe (refractive index about 2.4 at λ=11 μm) which is transparent to radiation of wavelength of about 0.6 μm to about 16 μm. Optical measurement showed that these patterns acted as notch filters in the infrared range. A microlens array was fabricated as described above in the context of Example 1 and was used in projection lithography as described in the context of Example 2. Specifically, a desktop printer with a resolution of 3386 dpi was used to print a pattern on a mask, this, along with a microlens array comprising an ordered planar arrangement of 6 μm diameter polystyrene spherically-shaped microoptical components, was used in conjunction with an overhead transparency projector to project and fabricate the pattern on a photoresist material (MICROPOSIT® 1805, available from Shipley Company, L.L.C., Marlborough, Mass.). The resist layer was about 0.5 μm thick and the exposure time was between about 0.5 to about 4 minutes. The microlens array was positioned about 15-20 cm from the mask. After exposure, the membrane containing the microlens array was removed from the photoresist substrate, which was developed in a solution of sodium hydroxide, MICROPOSIT® 351 developer (available from Shipley Company, L.L.C., Marlborough, Mass.). After drying under a nitrogen gas stream, the developed layer had an array of micropatterns, either as shown in the photocopy of the micrographs of FIG. 14A or 14B, depending on the photomask (upper left of FIGS. used). To transfer the micropatterns in the resist layer to a thin film of metal, the substrate was coated with a thin film of aluminum, by electron-beam evaporation, and then lifted off the photoresist material using acetone.

To improve efficiency of the FSS, dense arrays of microlenses were used to fabricate dense arrays of metallic micropatterns. Since 2D arrays of transparent microspheres can act as dense arrays of microlenses, these were selected to be used to generate hexagonal arrays of metallic micropatterns.

Figure 14A:
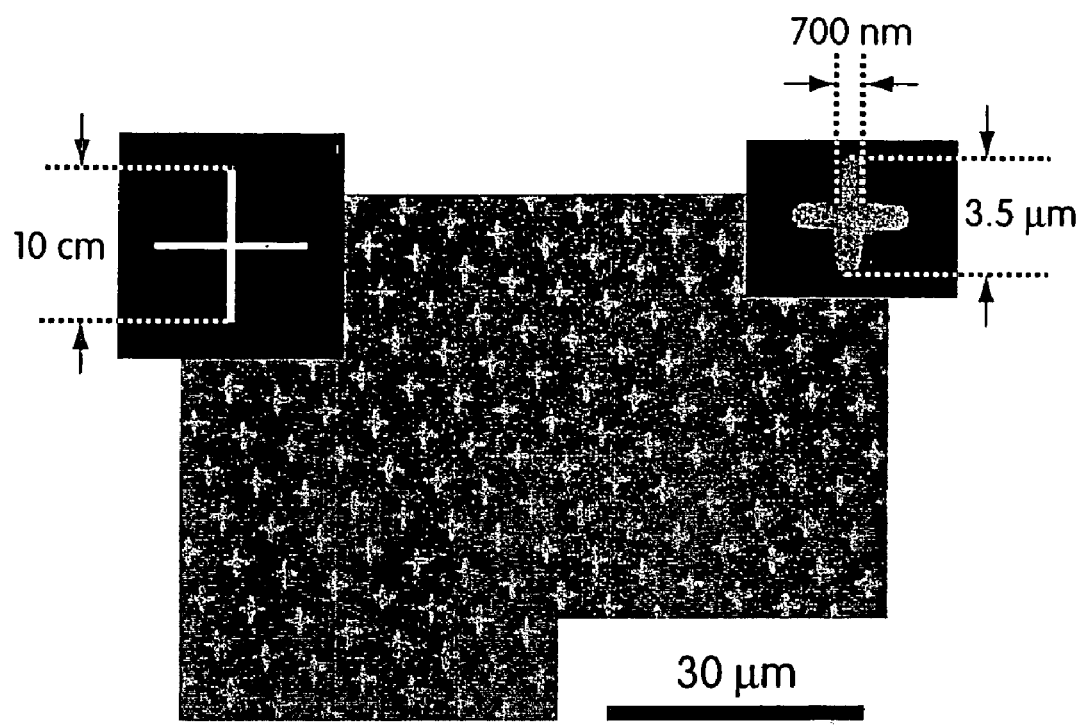
FIGS. 14A and 14B are photocopies of micrographs showing patterns on 50 nm aluminum thin films on ZnSe substrates, generated using a 2D crystal of 6 μm diameter polystyrene microoptical components.
Figure 14B:
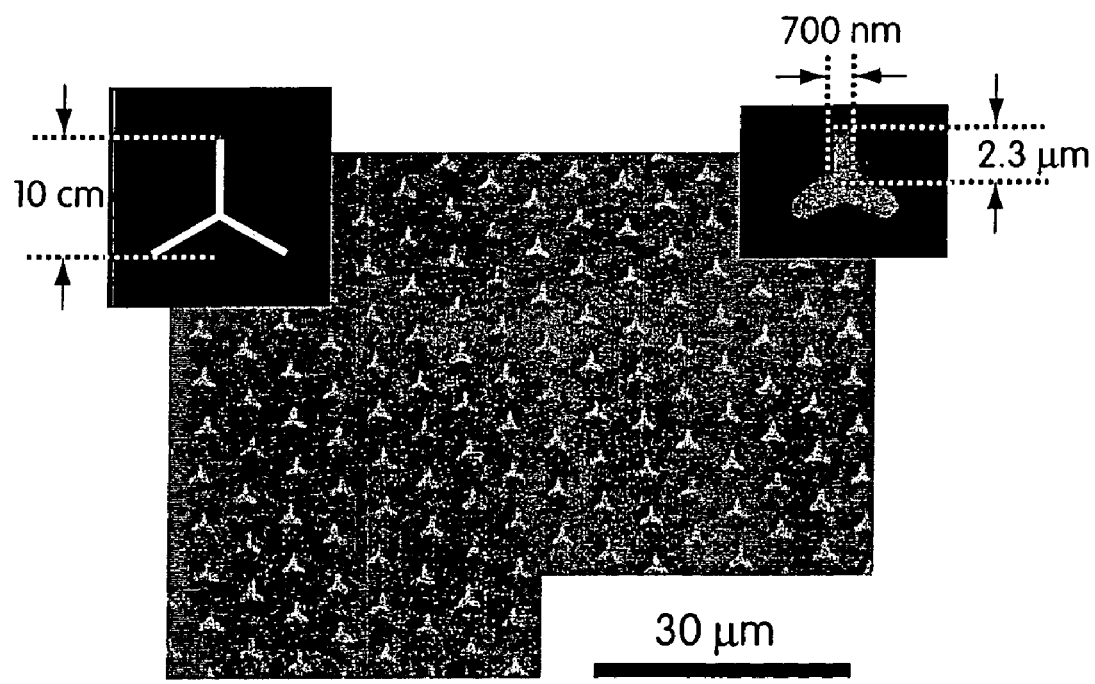

FIGS. 14A and 14B are photocopies of micrographs showing the patterns on 50 nm aluminum thin films coated on ZnSe substrates, generated using a 2D crystal of 6 μm diameter polystyrene microoptical components. The patterns were transferred on the aluminum thin film by depositing aluminum, by e-beam evaporation, and removing the aluminum thin film in acetone. In FIG. 14A, showing a pattern with an array of cross-shaped structures in thin film aluminum, the length of each arm of the cross-shaped structure was about 3.5 μm. In FIG. 14B, showing a pattern of tripole-shaped structures on thin film aluminum, the length of each arm was measured to be about 2.3 μm. Each pattern should be useful as a capacitive resonant mesh that should exhibit bandstop transmittance properties. The sizes of the cross-shaped or tripole-shaped micropatterns were about half of the diameter of the 6 μm microoptical components of the microlens array.

Figure 15:
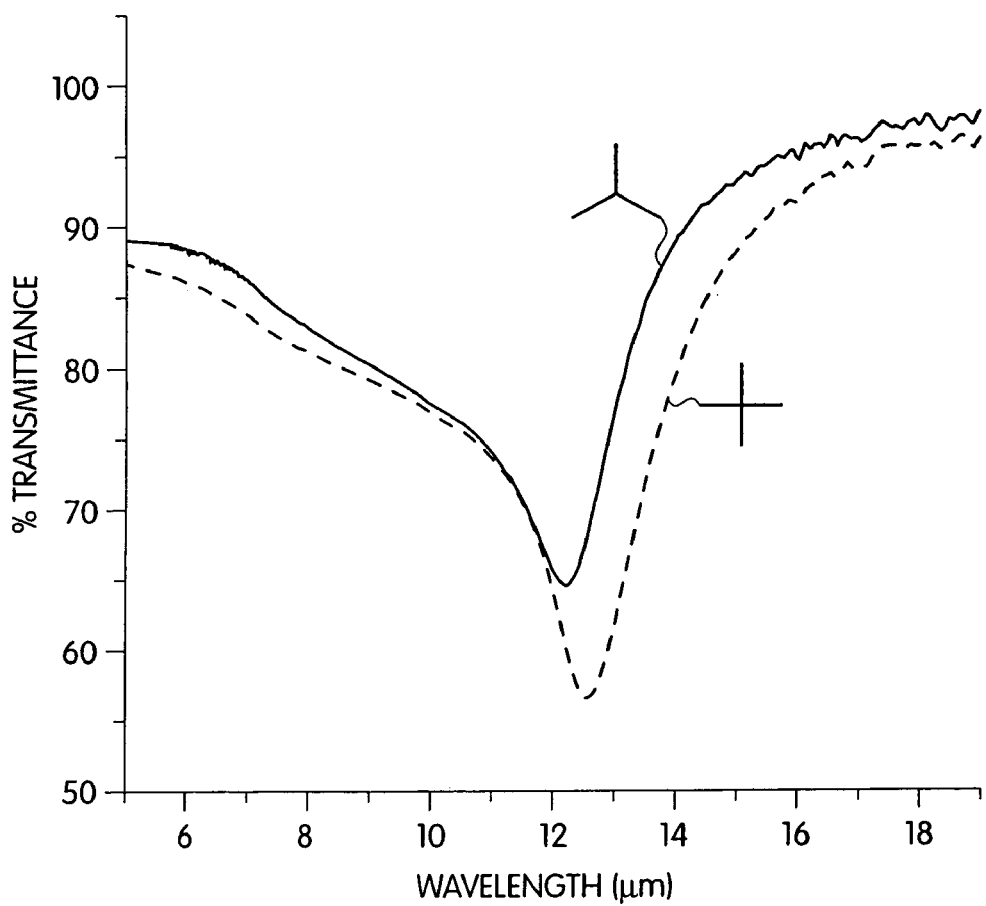
FIG. 15 is a graph showing the transmission spectrum of each of the cross-type FSS specimens shown in FIGS. 14A and 14B.

A NEXUS 670 FT-IR spectrometer, available from Thermo Nicolet, Madison, Wis., was used to measure and evaluate the spectral transmittance of the resulting FSS. FIG. 15 is a graph showing the transmission spectrum of each of the cross-type FSS specimens shown in FIGS. 14A (lower line) and 14B (upper line). As shown, the transmittance of the FSS specimen shown in FIG. 14A, at a wavelength of about 12.6 μm, was about 57%. The transmittance of the FSS specimen shown in FIG. 14B, at a wavelength of about 12.3 μm, was about 63%. The measured results are consistent with the theoretically predicted values.

EXAMPLE 11

Fabrication of Photomasks Using Microlens Projection Lithography and us of Such Photomasks for Conventional Projection Photolithography Microlens projection lithography, as described, for example, in Example 2, can produce micropatterns with sub-micron features as previously demonstrated. The present example describes a method for performing microlens projection lithography that can achieve similar pattern feature sizes and reduction factors as described above, but with the ability to use an even greater range of microoptical component sizes (e.g. larger sizes) than for some of the previously mentioned methods employing printed photomasks. In some cases, the methods of the current example can also improve resolution of projected micropatterns in off-axial image fields of the microoptical components.

To improve resolution in off-axial image fields, with the ability of utilizing relatively large (e.g. >30 μm) microlenses, a two-stage method was used. In the first stage, microarrays of low-NA lenses were used to fabricate opaque, chromium micropatterned masks with medium resolution (i.e.>2 μm) on glass substrates. The area of the chromium micropatterns was about 2.5 cm×2.5 cm. In the second stage, the chromium masks produced in first step were used in conventional projection photolithography (with a size reduction of an order of only 4x or 5x) to generate size-reduced micropatterns. This two-stage technique allowed the formation of sub-micron features over the whole image fields (about 0.5×0.5 cm² for about 5x reduction).

EXAMPLE 12

Fabrication of Conformable Photomasks Using Microlens Projection Lithography and Use of Such Photomasks for Near-field Contact Photolithography Conformable photomasks can be fabricated from different types of materials including, but not limited to, thin membranes of rigid materials, such as glass and silicon nitride, and elastomeric membranes of transparent polymers, such as PDMS, as discussed by, for example, Goodberlet, J. G., "Patterning 100 nm features using deep-ultraviolet contact lithography, *Appl. Phys. Lett.* 76, 667-669 (2000) and Alkaisi, M.

M. et al., "Nanolithography using wet etched silicon nitride phase masks," *J. Vac. Sci. Technol. B* 16, 3929-3933 (1998); Rogers, J. A. et al., "Wave-front engineering by use of transparent elastomeric optical elements," *Appl. Opt.*, 36, 5792-5795 (1997) and Rogers, J. A. et al., "Qualifying distortion in soft lithography," *J. Vac. Sci. Technol. B*, 16, 88-97 (1998), which are incorporated herein by reference. This example focused on the fabrication and the use of PMDS membranes as photomasks for near-field contact photolithography.

Figure 16A:
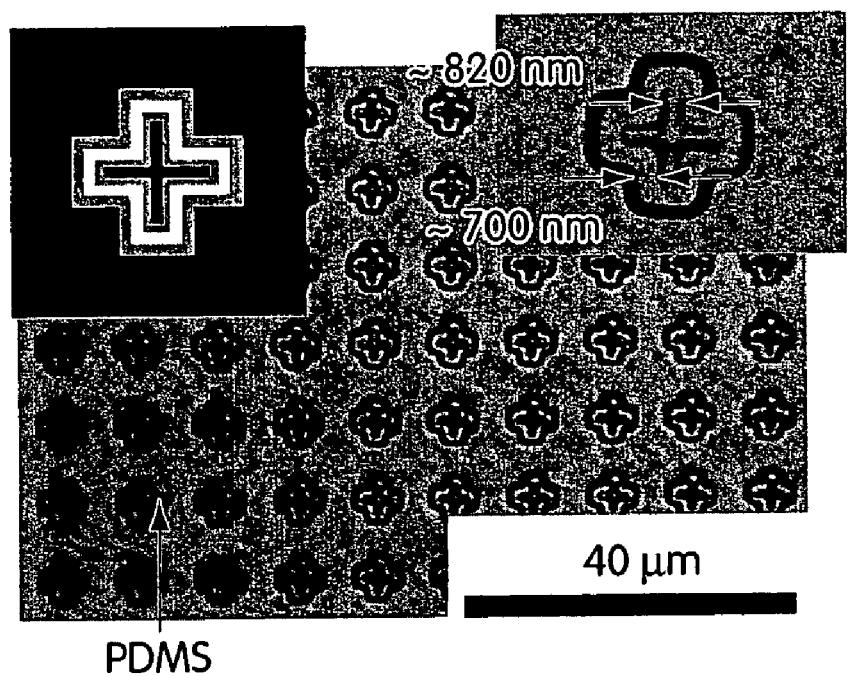
FIGS. 16A and 16B are photocopies of micrographs.

The fabrication of PDMS membranes with topographically patterned surfaces has been described above. In this example, microprojection lithography was performed, as described in the context of Example 2, to fabricate a substrate having 3D structures as shown in the photocopy of the SEM micrographs in FIG. 16A. Specifically, the mask comprising the pattern, shown in the upper left insert, was projected using UV light (using Model MJB3 UV400 Karl Suss mask aligner (not shown)), onto a substrate comprising photoreactive material (about 0.4 μm thick, MICROPOSIT® S1805 photoresist, available from the Shipley Company, L.L.C., Marlborough, Mass.). After UV exposure of at least one second, the photoresist material was developed, using MICROPOSIT® 351 developer (available from Shipley Company, L.L.C., Marlborough, Mass.). PDMS, SYLGARD® 184 silicone elastomer (available from Dow Corning Corp., Midland, Mich.) was then cast and allowed to cure on the developed photoreactive material. The cured PDMS was removed thus transferring corresponding features of the structures to the PDMS substrate. The insert in the upper right is a magnified photocopy of the AFM micrograph of the PDMS substrate.

Figure 16B:
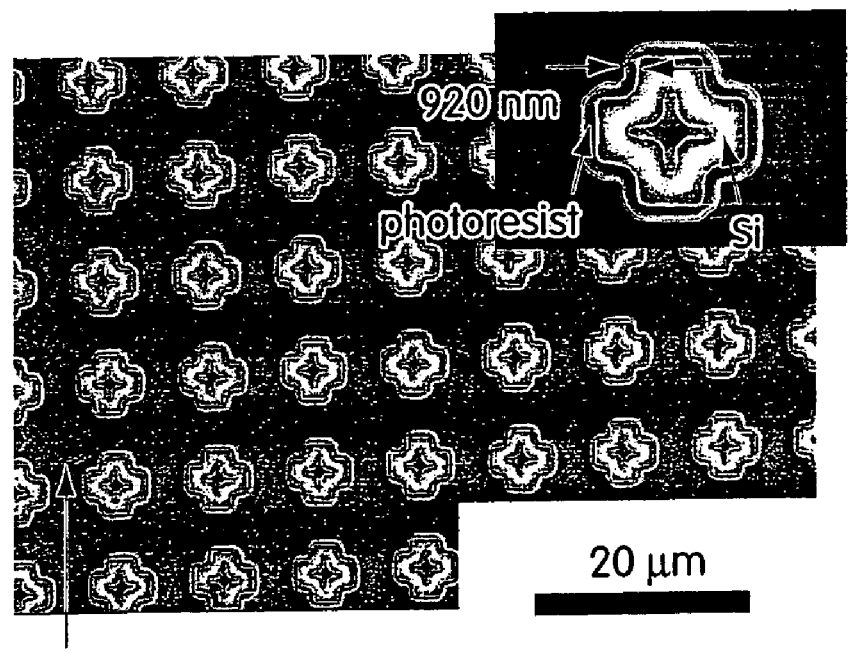

The resulting PDMS substrate was then used as a conformal photomask to fabricate the 3D structures shown in the photocopy of the SEM micrograph of FIG. 16B. Specifically, the PDMS photomask shown in FIG. 16A was placed in conformal contact (i.e., near-field lensing) with a photoreactive substrate (MICROPOSIT® S1805 photoresist, available from the Shipley Company, L.L.C., Marlborough, Mass.). The photoresist material was exposed to UV radiation through the photomask using substantially similar techniques as described above. The PDMS photomask was removed from UV-exposed substrate, which was developed using known techniques. The developed photoresist material is shown in FIG. 16B. As shown in FIG. 16B, the central, cross-shaped features, which correspond to those in FIG. 16A, acted as divergent lenses and generated cross-shaped features in the photoresist as shown more clearly in the enlarged insert. A LEO 982 FE-SEM microscope (not shown), available from LEO Electron Microscopy, Inc., Thornwood, N.Y., at 1 keV, was used to generate the micrographs.

This example shows that microlens projection lithography can fabricate flexible photomasks with repetitive micropatterns. These photomasks have sufficient quality for the fabrication of sub-micron features and can be used to conformally contact and form patterns on both planar and non-planar substrates.

Further modifications and equivalents of the invention herein disclosed will occur to persons skilled in the art using no more than routine experimentation and all such modifications and equivalents are believed to be within the spirit and scope of the invention as defined by the following claims. For example, those skilled in the art would recognize that preferred characteristics of the projected electromagnetic radiation, such as its polarization, wavelength, and coherence distribution, or any combination thereof, can be manipulated to produce structures on a substrate.

What is claimed is:

1. A method for creating an image of a pattern on a surface of a substrate comprising projecting a pattern of electromagnetic radiation through a device comprising a plurality of optical components arranged in an array and associated with a support element to create an image of the pattern on the surface of the substrate, wherein a feature of the image is at least 100 times smaller than a corresponding feature of the pattern, and wherein the support element has an index of refraction less than an index of refraction of at least a portion of the optical components.

2. The method as in claim 1, wherein the device comprises a microlens array.

3. The method as in claim 1, wherein the feature of the image is at least 1000 times smaller than the corresponding feature of the pattern.

4. The method as in claim 1, wherein a spacing element is used to position the optical components.

5. The method as in claim 1, wherein the projected electromagnetic radiation effects a response that topographically alters the substrate.

6. The method as in claim 1, Wherein the pattern is a three dimensional structure.

7. The method as in claim 1, wherein the pattern has a cone shape.

8. The method as in claim 1, wherein the pattern has a ring shape.

9. The method as in claim 1, wherein the pattern has interconnecting features.

10. A method for creating an image of a pattern on a surface of a substrate comprising projecting a pattern of electromagnetic radiation through a device comprising a plurality of optical components arranged in an array and associated with a support element to create an image of the pattern on the surface of the substrate, wherein a feature of the image is at least 100 times smaller than a corresponding feature of the pattern, and wherein at least a portion of the optical components comprises a graded-index fiber.

11. A method for creating an image of a pattern on a surface of a substrate comprising projecting a pattern of electromagnetic radiation through a device comprising a plurality of optical components arranged in an array and associated with a support element to create an image of the pattern on the surface of the substrate, wherein a feature of the image is at least 100 times smaller than a corresponding feature of the pattern, and wherein at least a portion of the optical components has a smallest cross-sectional dimension that is less than about 1000 micrometers.

12. The method as in claim 10, wherein the device comprises a microlens array.

13. The method as in claim 10, wherein the feature of the image is at least 1000 times smaller than the corresponding feature of the pattern.

14. The method as in claim 10, wherein a spacing element is used to position the optical components.

15. The method as in claim 10, wherein the projected electromagnetic radiation effects a response that topographically alters the substrate.

16. The method as in claim 10, wherein the pattern is a three dimensional structure.

17. The method as in claim 10, wherein the pattern has a cone shape.

18. The method as in claim 10, wherein the pattern has a ring shape.

19. The method as in claim 10, wherein the pattern has interconnecting features.

20. The method as in claim 11, wherein the device comprises a microlens array.

21. The method as in claim 11, wherein the feature of the image is at least 1000 times smaller than the corresponding feature of the pattern.

22. The method as in claim 11, wherein a spacing element is used to position the optical components.

23. The method as in claim 11, wherein the projected electromagnetic radiation effects a response that topographically alters the substrate.

24. The method as in claim 11, wherein the pattern is a three dimensional structure.

25. The method as in claim 11, wherein the pattern has a cone shape.

26. The method as in claim 11, wherein the pattern has a ring shape.

27. The method as in claim 11, wherein the pattern has interconnecting features.

* * * * *